US009633916B2

(12) United States Patent
Hong et al.

(10) Patent No.: US 9,633,916 B2
(45) Date of Patent: Apr. 25, 2017

(54) DISPLAY PANEL AND METHOD OF MANUFACTURING THE SAME

(71) Applicant: Samsung Display Co., LTD., Yongin, Gyeonggi-Do (KR)

(72) Inventors: Ji-Yun Hong, Seoul (KR); Joon-Geol Kim, Hwaseong-si (KR); Jin-Won Lee, Cheonan-si (KR); Ki-Won Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 296 days.

(21) Appl. No.: 14/458,152

(22) Filed: Aug. 12, 2014

(65) Prior Publication Data

US 2015/0144940 A1    May 28, 2015

(30) Foreign Application Priority Data

Nov. 22, 2013   (KR) .................. 10-2013-0142570

(51) Int. Cl.
*H01L 21/66*  (2006.01)
*H01L 27/12*  (2006.01)
*G09G 3/00*   (2006.01)

(52) U.S. Cl.
CPC ............ *H01L 22/32* (2013.01); *H01L 27/124* (2013.01); *G09G 3/006* (2013.01); *H01L 22/14* (2013.01); *H01L 27/1225* (2013.01)

(58) Field of Classification Search
CPC ......................................................... H01L 2/32
See application file for complete search history.

(56) References Cited

U.S. PATENT DOCUMENTS

| 7,414,323 B2 | 8/2008 | Hirae |
| 7,580,107 B2 | 8/2009 | Moon |
| 7,864,288 B2* | 1/2011 | Wang ................. G02F 1/136286 349/147 |
| 8,432,040 B2 | 4/2013 | Yu et al. |
| 2004/0125307 A1* | 7/2004 | Lee ........................ G02F 1/1362 349/149 |
| 2010/0109693 A1* | 5/2010 | Lee ........................ G09G 3/006 324/760.01 |

FOREIGN PATENT DOCUMENTS

| JP | 2008-065152 | 3/2008 |
| JP | 2010-266467 | 11/2010 |
| KR | 10-2007-0076843 | 7/2007 |
| KR | 10-2009-0043749 | 5/2009 |

\* cited by examiner

*Primary Examiner* — Seahvosh Nikmanesh
(74) *Attorney, Agent, or Firm* — Innovation Counsel LLP

(57) ABSTRACT

A display panel includes first to third test lines connected to the each of data lines, extending in the second direction, and arranged in the first direction, a first test pad electrically connected to the first test line, the first test pad and the first test line being formed from a same layer, a second test pad electrically connected to the second test line through a contact hole formed through a first insulation layer, and disposed adjacent to the first test pad in the second direction, a third test pad electrically connected to the third test line and disposed adjacent to the first test pad in the first direction, the third test pad and the third test line being formed from a same layer.

14 Claims, 22 Drawing Sheets

FIG. 17
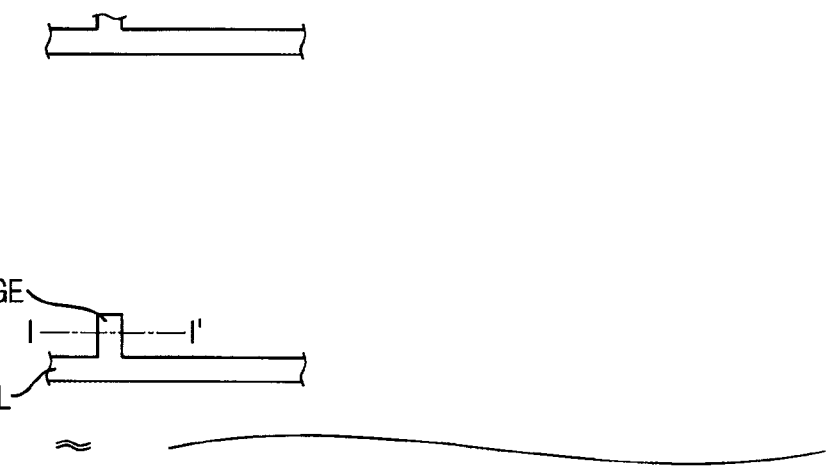
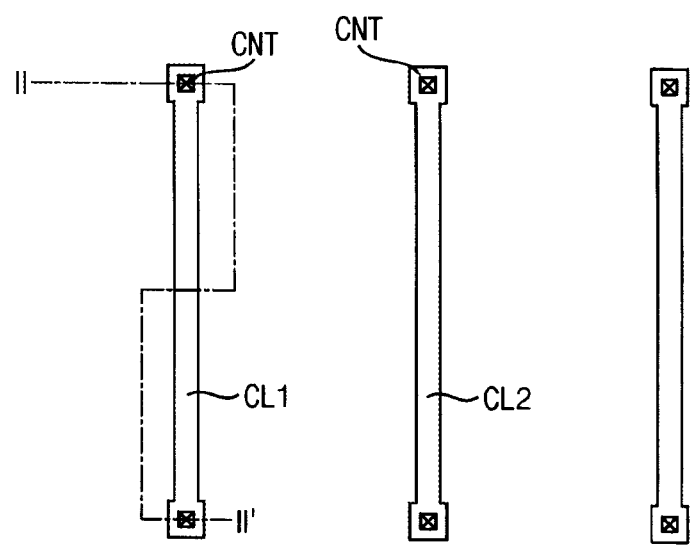
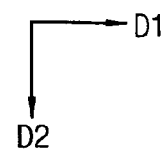

FIG. 18
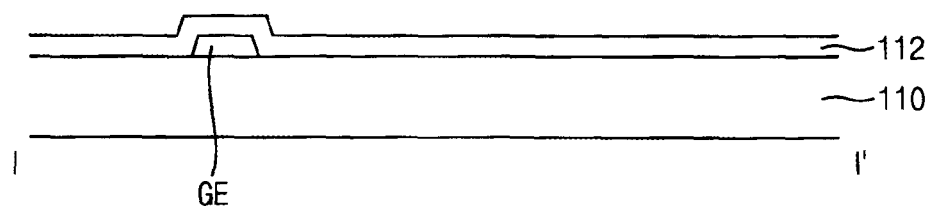
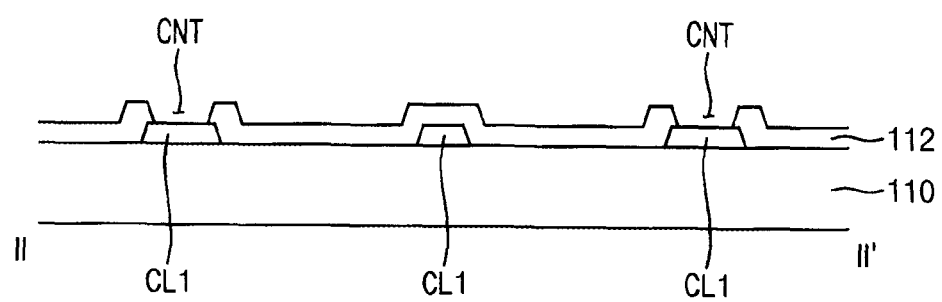

DISPLAY PANEL AND METHOD OF MANUFACTURING THE SAME

This application claims priority under 35 U.S.C. §119 to Korean Patent Application No. 10-2013-0142570 filed on Nov. 22, 2013, the disclosure of which is incorporated by reference herein in its entirety.

BACKGROUND

1. Field

Exemplary embodiments of the inventive concept relate to a display panel and a method of manufacturing the display panel.

More particularly, exemplary embodiments of the inventive concept relate to a display panel for a liquid crystal display apparatus and a method of manufacturing the display panel.

2. Description of the Related Art

Generally, a liquid crystal display (LCD) device has various advantageous characteristics such as thin thickness, lightweight, low power consumption, etc. Thus, the LCD device has been widely used in a monitor, a notebook computer, a cellular phone, TV etc. The LCD device includes an LCD panel displaying an image by altering an optical transmissivity of liquid crystal and a backlight assembly disposed under the LCD panel to provide light to the LCD panel.

The LCD apparatus applies a voltage to a liquid crystal layer to change the arrangement of liquid crystal molecules. The LCD apparatus displays an image by changing optical property (for example, birefringence, rotatory polarization, dichroism and light scattering) of a liquid crystal cell according to the changes of the molecular arrangement.

SUMMARY

A method of manufacturing the LCD panel includes testing a circuit wiring. A plurality of test pads for the testing are formed in a test area which is disposed a boundary of the LCD panel. The image is not displayed on the test area, so that a size the test area is getting smaller as the number of pixel increases.

One or more exemplary embodiment of the inventive concept provides a display panel including a plurality of test pad which are efficiently arranged.

One or more exemplary embodiments of the inventive concept also provide a method of manufacturing the display panel.

According to an exemplary embodiment of the inventive concept, a display panel includes a base substrate, a gate pattern disposed on the base substrate, a data pattern disposed on the base substrate, and a first insulation layer disposed between the gate pattern and the data pattern. The display panel is divided a display area in which an image is displayed and a test area disposed adjacent to the display area. In the display area, the display panel includes a plurality of gate lines extending in a first direction, a plurality of data lines crossing the gate line and extending in a second direction substantially perpendicular to the first direction, and a switching element electrically connected to the gate line and the data line. In the test area, the display panel includes first to fourth test lines connected to the each of the data lines, extending in the second direction, and arranged in the first direction, a first test pad electrically connected to the first test line, the first test pad and the first test line being formed from a same layer, a second test pad electrically connected to the second test line through a contact hole formed through the first insulation layer, and disposed adjacent to the first test pad in the second direction, a third test pad electrically connected to the third test line and disposed adjacent to the first test pad in the first direction, the third test pad and the third test line being formed from a same layer, and a fourth test pad electrically connected to the fourth test line through a contact hole formed through the first insulation layer, and disposed adjacent to the third test pad in the second direction.

In an exemplary embodiment, the data pattern may include the first to fourth test lines.

In an exemplary embodiment, the gate pattern may include the gate line and the first and third test pads.

In an exemplary embodiment, test contact holes exposing the first and third test pads may be formed through the first insulation layer.

In an exemplary embodiment, the display panel may further include a first connecting line which electrically connects the second test pad to the second test line, and a second connecting line which electrically connects the fourth test pad to the fourth test line. The gate pattern may include the first connecting line and the second connecting line.

In an exemplary embodiment, the data pattern may include the second test pad and the fourth test pad. The second test pad may be electrically connected to the first connecting line though a contact hole formed through the first insulation layer. The fourth test pad may be electrically connected to the second connecting line though a contact hole formed through the first insulation layer.

In an exemplary embodiment, the first connecting line may overlap the first test pad. The second connecting line may overlap the third test pad.

In an exemplary embodiment, the first connecting line may be disposed between the first test pad and the second test pad. The first connecting line may partially overlap the first and second test pads.

In an exemplary embodiment, a gap between the first test pad and the third test pad may be same as or smaller than a width of the first test line.

In an exemplary embodiment, the display panel further include a fifth test line disposed between the first test pad and the third test pad and between the second test pad and the fourth test pad, and a fifth test pad electrically connected to the fifth test line and adjacent to the second test pad in the second direction.

In an exemplary embodiment, the display panel may further include a third connecting line disposed between the first connecting line and the second connecting line, a fifth connecting line disposed between the second test line and the third test line, and electrically connected to the third connecting line through a contact hole formed through the first insulation layer, and a fifth test pad electrically connected to the fifth test line.

In an exemplary embodiment, the gate pattern may include the third connecting line. The data pattern may include the fifth test line and the fifth test pad.

In an exemplary embodiment, the display panel may further include a second insulation layer disposed on the data pattern, and a pixel electrode disposed on the second insulation layer, and electrically connected to the switching element.

In an exemplary embodiment, the switching element may overlap the gate electrode, and include an active pattern disposed between the first insulation layer and the source and drain electrodes. The active pattern may include an oxide semiconductor. The oxide semiconductor may include the an amorphous oxide including at least one selected from the group consisting of indium (In), zinc (Zn), gallium (Ga), tin (Sn) and hafnium (Hf).

According to another exemplary embodiment of the inventive concept, a method of manufacturing a display panel includes forming a gate pattern on the base substrate, the gate pattern including first and second connecting lines which are arranged in a first direction and extending in a second direction substantially perpendicular to the first direction, forming first insulation layer on the gate pattern and forming a plurality of contact holes exposing the first and second connecting lines, forming an active pattern and a data pattern which includes first to fourth test lines arranged in the first direction, testing the gate pattern, the active pattern and the data pattern, forming a second insulation layer on the data pattern, and forming a pixel electrode on the second insulation layer. Each of the first to fourth test lines extends in the second direction. The second test line is electrically connected to the first connecting line through the contact hole. The fourth test line is electrically connected to the second connecting line through the contact hole;

In an exemplary embodiment, forming the gate pattern may include forming a second test pad electrically connected to the first connecting line and a forth test pad adjacent to the second test pad in the first direction. The forth test pad may be electrically connected to the second connecting line. Forming the data pattern may include forming a first test pad and a third test pad. The first test pad may be electrically connected to the first test line and disposed adjacent to the second test pad in the first direction. The third test pad may be electrically connected to the third test line and disposed adjacent to the first test pad in the first direction.

In an exemplary embodiment, the method further include forming a plurality of test contact holes exposing the first and third test pads through the second insulation layer, after forming the second insulation layer.

In an exemplary embodiment, forming the data pattern may include forming a first test pad, a second test pad, a third test pad and a fourth test pad. The first test pad may be electrically connected to the first test line. The third test pad may be electrically connected to third test line and disposed adjacent to the first test pad in the first direction. The second test pad may be electrically connected to the first connecting line though the contact hole and disposed adjacent to the second test pad in the second direction. The fourth test pad may be electrically connected to the second connecting line though the contact hole and disposed adjacent to the second test pad in the first direction.

In an exemplary embodiment, the gate pattern may include a gate line and a gate electrode electrically connected to the gate line. The data pattern may include a data line, a source electrode electrically connected to the data line, and a drain electrode.

In an exemplary embodiment, the active pattern may include an oxide semiconductor. The oxide semiconductor may include the an amorphous oxide including at least one selected from the group consisting of indium (In), zinc (Zn), gallium (Ga), tin (Sn) and hafnium (Hf).

According to the exemplary embodiments of the present inventive concept, a display panel includes a connecting line formed from a same layer as a gate line and overlapping a test pad. Although a gap between the test lines (or data lines) deceases as the number of pixel increases, sizes the test pads may be sufficiently large to test the display panel.

BRIEF DESCRIPTION OF THE DRAWINGS

The above and other features of the inventive concept will become more apparent by exemplary embodiments which explain the inventive concept in detail with reference to the accompanying drawings, in which:

FIGS. 17 to 20B are plan views and cross-sectional views illustrating a method of manufacturing the display panel of FIG. 6.

DETAILED DESCRIPTION

Hereinafter, the inventive concept will be explained in detail with reference to the accompanying drawings.

Figure 1:
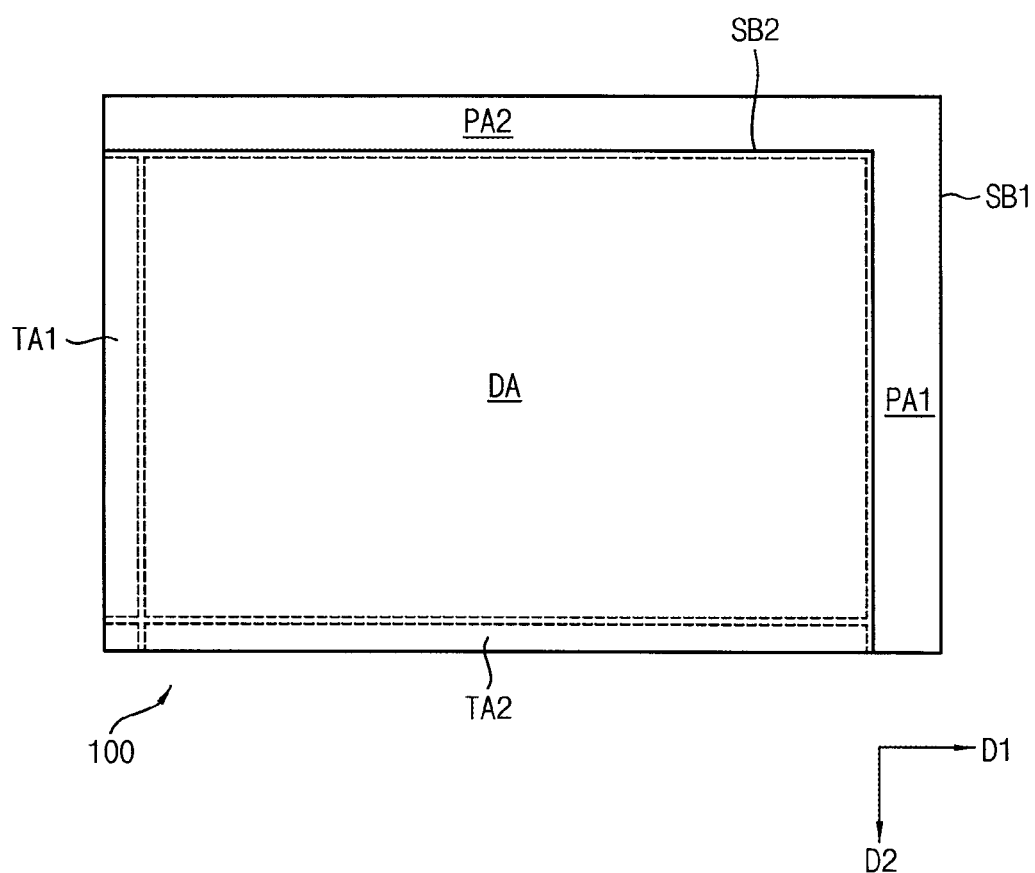
FIG. 1 is a plan view illustrating an exemplary embodiment of a display panel according to the inventive concept.

FIG. 1 is a plan view illustrating an exemplary embodiment of a display panel according to the inventive concept.

Referring to FIG. 1, a display panel includes a first substrate SB1, a second substrate SB2 and a liquid crystal layer 130 disposed between the first substrate SB1 and the second substrate SB2.

In a plan view, the display panel includes a display area DA and a non-display area NDA which includes a peripheral area and a test area. The peripheral area includes a first peripheral area PA1 and a second peripheral area PA2. The test area includes a first test area TA1 and a second test area TA2.

An image is displayed in the display area DA.

The first peripheral area PA1 is adjacent to the display area DA in a first direction D1. A plurality of input and out put terminals configured to connect the display panel 100 to a driving part (not shown) to drive the display panel 100 may be formed in the first peripheral area PA1.

The second peripheral area PA2 is adjacent to the display area DA in a second direction D2. A plurality of input and out put terminals configured to connect the display panel 100 to a driving part (not shown) to drive the display panel 100 may be formed in the second peripheral area PA2.

The first test area TA1 is adjacent to the display area DA in the first direction D1 opposite to the first peripheral area PA1. A plurality of gate pads to test a plurality of gate lines may be formed in the first test area TA1.

The second test area TA2 is adjacent to the display area DA in the second direction D2 opposite to the second peripheral area PA2. A plurality of data pads to test a plurality of data lines may be formed in the second test area TA2.

Figure 2:
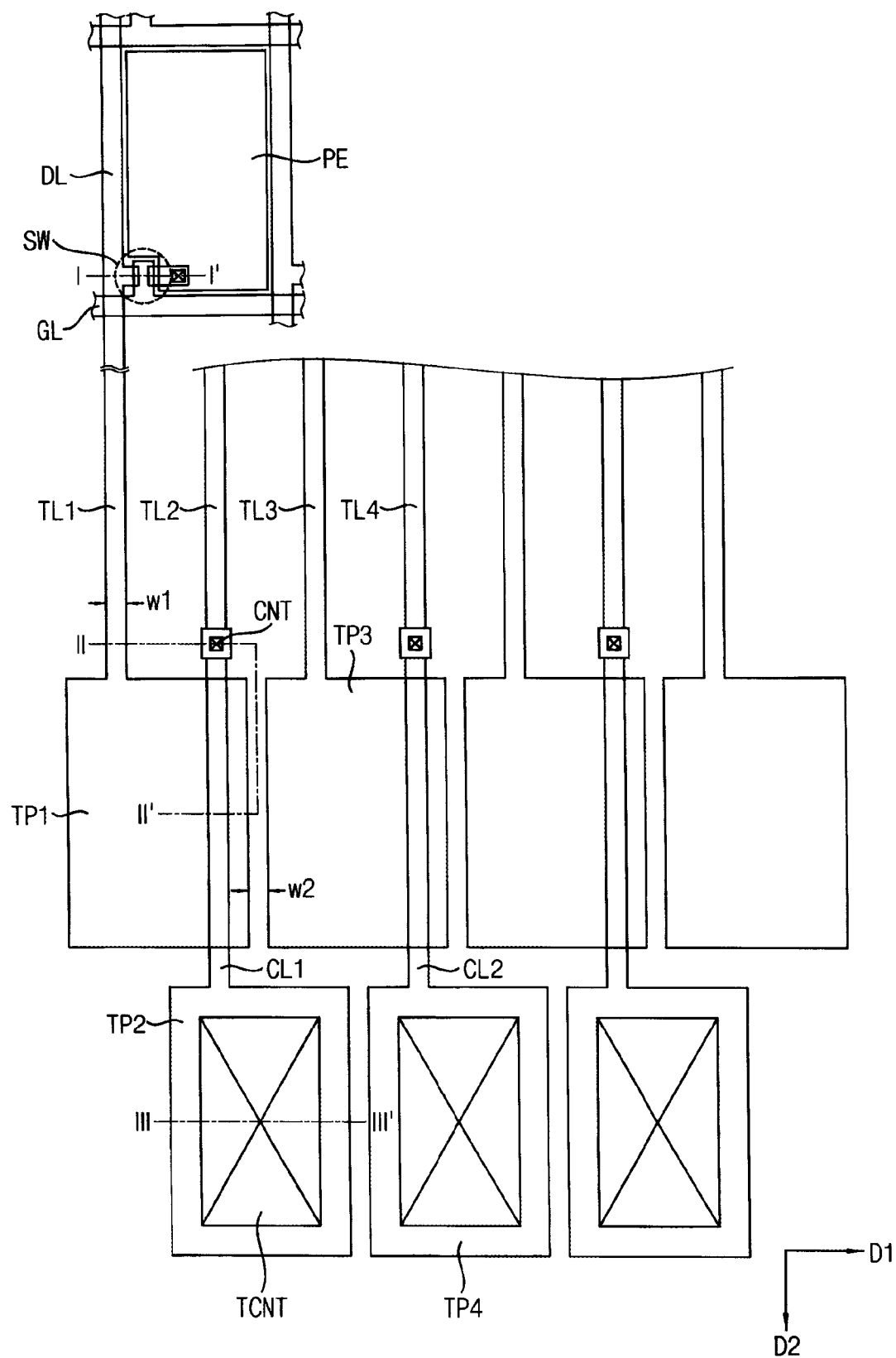
FIG. 2 is an enlarged plan view illustrating a portion of a display area and a portion of a test area of FIG. 1.
Figure 3A:
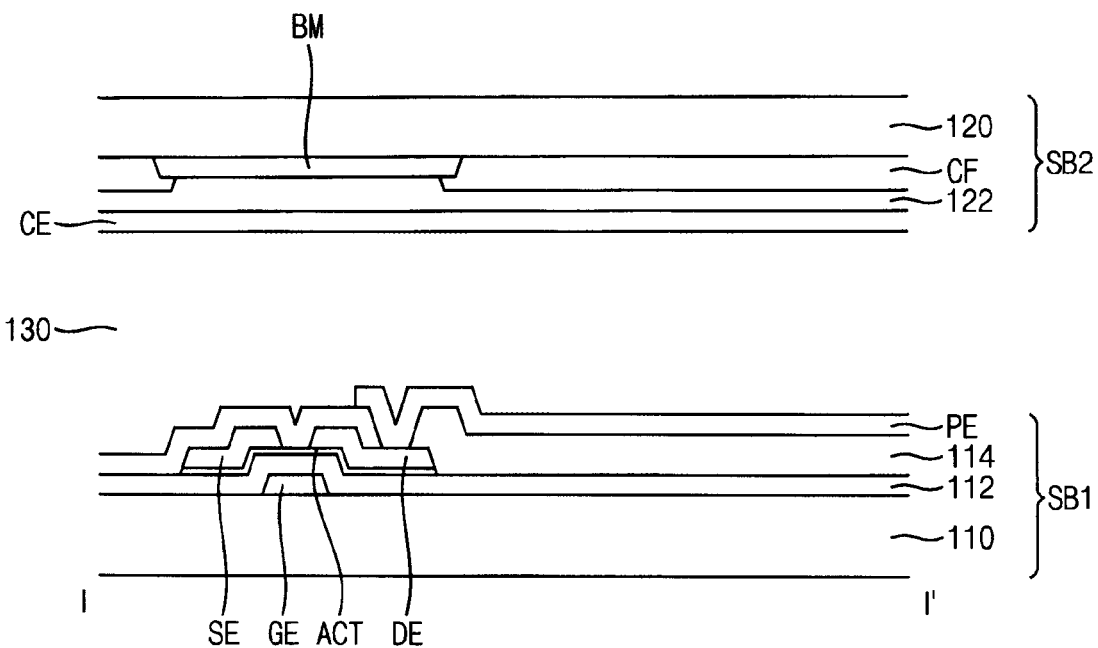
FIGS. 3A to 3C are cross-sectional views taken along a line I-I', a line II-II' and a line III-III' of FIG. 2.
Figure 3B:
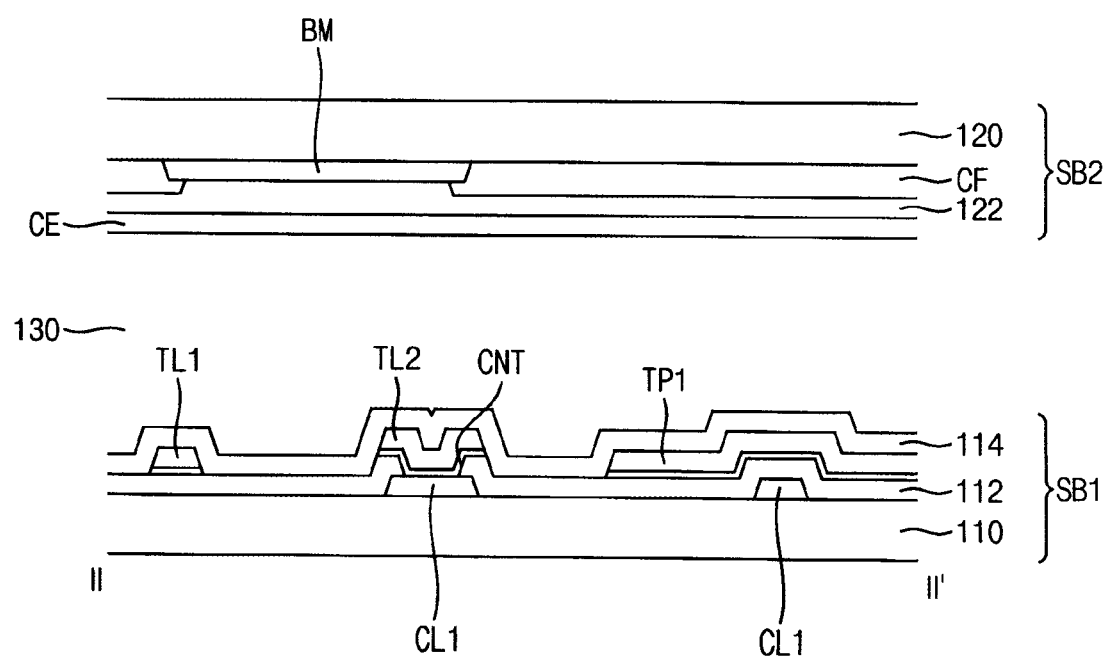
Figure 3C:
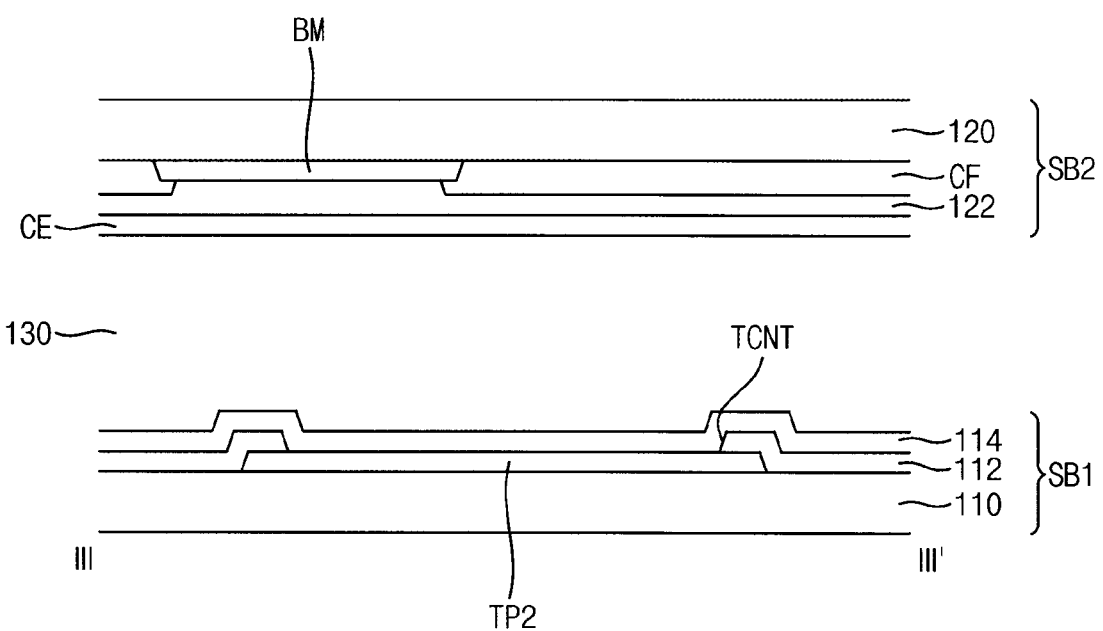

FIG. 2 is an enlarged plan view illustrating a portion of a display area and a portion of a test area of FIG. 1. FIGS. 3A to 3C are cross-sectional views taken along a line I-I', a line II-II' and a line III-III' of FIG. 2.

Referring to FIGS. 2 and 3C, a display panel includes a first substrate SB1, a second substrate SB2, a liquid crystal layer 130 disposed between the first substrate SB1 and the second substrate SB2 in a display area (refers to DA of FIG. 1).

The first substrate SB1 includes a first base substrate 110, a gate line GL, a gate electrode GE, a first insulation layer 112, an active pattern ACT, a data line DL, a source electrode SE, a drain electrode DE, a second insulation layer 114 and a pixel electrode PE.

The first base substrate 110 may include an insulation substrate. In addition, the first base substrate 110 may include a flexible substrate. For example, the first base substrate 110 may include a glass substrate, a quartz substrate, a transparent resin substrate, etc. Examples of the transparent resin substrate for the first base substrate 110 may include polyimide-based resin, acryl-based resin, polyacrylate-based resin, polycarbonate-based resin, polyether-based resin, sulfonic acid containing resin, polyethyleneterephthalate-based resin, etc.

The gate line GL and the gate electrode GE is disposed on the first base substrate 110. The gate line GL extends in the first direction D1. The gate electrode GE is electrically connected to the gate line GL. The gate line GL and the gate electrode GE may include conductive material such as metal, metal alloy, conductive metal oxide, a transparent conductive material, etc.

Although not illustrated in the figures, a buffer layer may be formed between the gate line GL and the first base substrate 110 and between the gate electrode and the first base substrate 110.

The first insulation layer 112 is disposed on the first base substrate 110 on which the gate line GL and the gate electrode GE are disposed. The first insulation layer 112 may include silicon oxide (SiOx), silicon nitride (SiNx), silicon oxynitride (SiOxNy), silicon oxycarbide (SiOxCy), silicon carbon nitride (SiCxNy), etc. These may be used alone or in any combination thereof. In addition, the first insulation layer 112 may have a single layer structure or a multi layer structure. For example, the first insulation layer 112 may have a single-layered structure including a silicon oxide film, a silicon nitride film, a silicon oxynitride film, a silicon oxycarbide film or a silicon carbon nitride film. Alternatively, the first insulation layer 112 may have a multilayered structure including at least two of a silicon oxide film, a silicon nitride film, a silicon oxynitride film, a silicon oxycarbide film, a silicon carbon nitride film, etc.

The active pattern ACT is disposed on the first insulation layer 112. The active pattern ACT overlaps the gate electrode GE. The active pattern ACT may include a semiconductor layer consisting of amorphous silicon (a-Si:H) and an ohmic contact layer consisting of n+ amorphous silicon (n+ a-Si:H). In addition, the active pattern ACT may include an oxide semiconductor. The oxide semiconductor may include an amorphous oxide including at least one selected from the group consisting of indium (In), zinc (Zn), gallium (Ga), tin (Sn) and hafnium (Hf). More particularly, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active pattern ACT may include indium gallium zinc oxide (IGZO).

The source electrode SE and the drain electrode DE may be disposed on the active pattern ACT. The data line DL may also be disposed on the active pattern ACT. The data line DL extends in a second direction D2 which is substantially perpendicular to the first direction D1. The data line DL crosses the gate line GL. The source electrode SE is electrically connected to the data line DL. The drain electrode DE is spaced apart from the source electrode SE. The data line DL, the source electrode SE and the drain electrode DE may include metal, metal alloy, conductive metal oxide, a transparent conductive material, etc.

The second insulation layer 114 is disposed on the first insulation layer 112 on which the active pattern ACT, the data line DL, the source electrode SE and the drain electrode DE are disposed. The second insulation layer 114 may include silicon oxide (SiOx), silicon nitride (SiNx), silicon oxynitride (SiOxNy), silicon oxycarbide (SiOxCy), silicon carbon nitride (SiCxNy), etc. These may be used alone or in any combination thereof. In addition, the second insulation layer 114 may have a single layer structure or a multi layer structure. For example, the second insulation layer 114 may have a single-layered structure including a silicon oxide film, a silicon nitride film, a silicon oxynitride film, a silicon oxycarbide film or a silicon carbon nitride film. Alternatively, the second insulation layer 114 may have a multilayered structure including at least two of a silicon oxide film, a silicon nitride film, a silicon oxynitride film, a silicon oxycarbide film, a silicon carbon nitride film, etc.

The pixel electrode PE is disposed on the second insulation layer 114. The pixel electrode PE is electrically connected to the drain electrode DE through a contact hole which is formed through the second insulation layer 114 and exposes the drain electrode DE. The pixel electrode PE may include transparent conductive material, such as indium tin oxide (ITO), indium zinc oxide (IZO) and etc. In addition, the pixel electrode PE may include titanium (Ti) and/or molybdenum titanium (MoTi).

The gate electrode GE, the active pattern ACT, the source electrode SE and the drain electrode DE form a switching element SW.

The second substrate SB2 includes a second bases substrate 120, a black matrix BM, a color filter CF, an overcoating layer 122 and a common electrode CE.

The second bases substrate 120 faces the first base substrate 110. The second substrate 120 may include an insulation substrate. In addition, the second bases substrate 120 may include a flexible substrate. For example, the second bases substrate 120 may include a glass substrate, a quartz substrate, a transparent resin substrate, etc. Examples of the transparent resin substrate for second bases substrate 120 may include polyimide-based resin, acryl-based resin, polyacrylate-based resin, polycarbonate-based resin, polyether-based resin, sulfonic acid containing resin, polyethylene-terephthalate-based resin, etc.

The black matrix BM is disposed on the second base substrate 120. The black matrix BM blocks light. The black matrix BM overlaps the switching element SW, the data line DL and the gate line GL. Although the black matrix BM overlaps the switching element SW, the data line DL and the gate line GL in the present example embodiment, the black matrix may be formed on anywhere the light should be blocked.

The color filter CF is disposed on the black matrix BM and the second base substrate 120. The color filter CF supplies colors to the light passing through the liquid crystal layer 130. The color filter CF may include a red color filter, a green color filter and blue color filter. The location of the color filter CF corresponds to a pixel area in which an image is disposed. The color filters adjacent to each other may have different colors. The color filter CF may be overlapped with adjacent color filter CF in a boundary of the pixel area. In addition, the color filter CF may be spaced apart from adjacent color filter CF in the boundary of the pixel area.

The over-coating layer 122 may be disposed on the black matrix BM and the color filter CF. The over-coating layer 122 flattens, protects and insulates the color filter CF. The over-coating layer 122 may be formed of acrylic-epoxy material.

The common electrode CE is disposed on the over-coating layer 122. The common electrode CE may include transparent conductive material, such as indium tin oxide (ITO), indium zinc oxide (IZO) and etc. In addition, the common electrode CE may include titanium (Ti) and/or molybdenum titanium (MoTi).

The liquid crystal layer 130 is disposed between the first substrate SB1 and the second substrate SB2. The liquid crystal layer 130 includes liquid crystal molecules having optical anisotropy. The liquid crystal molecules are driven by electric field, so that an image is displayed by passing or blocking light through the liquid crystal layer 130.

The display panel in the test area (refers to TA1 or TA2 of FIG. 1) may include the first substrate SB1, the second substrate SB2 and the liquid crystal layer 130 between the first substrate SB1 and the second substrate SB2.

The first substrate SB1 in the test area includes the first base substrate 110, connecting lines including a first connecting line CL1 and a second connecting line CL2, the first insulation layer 112, test lines including first to fourth test lines TL1 to TL4, test pads including first to fourth test pads TP1 to TP4, and the second insulation layer 114. The number of the connecting lines, the test lines and test pads are decided by the number of the gate lines and data lines.

The first connecting line CL1 is disposed on the first base substrate 110. The first connecting line CL1 extends in the second direction D2. The first connecting line CL1 may include a material substantially same as the gate line GL and the gate electrode GE. Thus, the first connecting line CL1 may include metal, metal alloy, conductive metal oxide, a transparent conductive material, etc.

The second connecting line CL2 is disposed on the first base substrate 110. The second connecting line CL2 extends in a second direction D2. The second connecting line CL2 may include a material substantially the same as the gate line GL and the gate electrode GE. Thus, the second connecting line CL2 may include metal, metal alloy, conductive metal oxide, a transparent conductive material, etc.

The second test pad TP2 is disposed on the first base substrate 110. The second test pad TP2 is connected to the first connecting line CL1. The second test pad TP2 may include a material substantially the same as the first connecting line CL1. Thus, the second test pad TP2 may include metal, metal alloy, conductive metal oxide, a transparent conductive material, etc.

The fourth test pad TP4 is disposed on the first base substrate 110. The fourth test pad TP4 is adjacent to the second test pad TP2 in the first direction D1. The fourth test pad TP4 is connected to the second connecting line CL2. The second test pad TP2 may include a material substantially the same as the second connecting line CL2. Thus, the fourth test pad TP4 may include metal, metal alloy, conductive metal oxide, a transparent conductive material, etc.

The first insulation layer 112 is disposed on the first connecting line CL1, the second connecting line CL2, the second test pad TP2 and the fourth test pad TP4. A contact hole CNT exposing a portion of the first connecting line CL1 and a portion of the second connecting line CL2 is formed through the first insulation layer 112.

A test contact hole exposing the second test pad TP2 and the fourth test pad TP4 is formed through the first insulation layer 112.

Each of the first to fourth test lines TL1 to TL4 extends in the second direction D2. The first to fourth test lines TL1 to TL4 are arranged in the first direction in order. Each of the first to fourth test lines TL1 to TL4 is electrically connected to each of the data lines in the display area DA. The first to fourth test lines TL1 to TL4 may include a material substantially the same as the data line DL, the source electrode SE and the drain electrode DE. The first to fourth test lines TL1 to TL4 may include metal, metal alloy, conductive metal oxide, a transparent conductive material, etc.

The second test line TL2 is electrically connected to the first connecting line CL1 through the contact hole CNT. The fourth test line TL4 is electrically connected to the second connecting line CL2 through a contact hole.

The first test pad TP1 is disposed on the first insulation layer 112. The first test pad TP1 is adjacent to the second test pad TP2 in the second direction D2. The first test pad TP1 is electrically connected to the first test line TL1. The first test pad TP1 may include a material substantially the same as the first test line TL1. Thus, the first test pad TP1 may include metal, metal alloy, conductive metal oxide, a transparent conductive material, etc.

The third test pad TP3 is disposed on the first insulation layer 112. The third test pad TP3 is adjacent to the first test pad TP1 in the first direction D1. The third test pad TP3 is disposed adjacent to the fourth test pad TP4 in the second direction D2. The third test pad TP3 is electrically connected to the third test line TL3. The third test pad TP3 may include a material substantially the same as the third test line TL3. Thus, the third test pad TP3 may include metal, metal alloy, conductive metal oxide, a transparent conductive material, etc.

Each of the first to fourth test lines TL1 to TL4 has a first width W1. The test pads which are disposed adjacent to each other in the first direction D1 (for example, the first test pad and the second test pad) are spaced apart from each other in the second width W2. The first connecting line CL1 overlaps the first test pad TP1, and the second connecting line CL2 overlaps the third test pad TP3, so that the second width W2 may be smaller than or equal to the first width W1.

Accordingly, although a gap between the test lines (gap between the data lines) decreases as the number of the pixels of the display panel increases, an area of the test pad may be sufficiently large to test the display panel.

The second insulation layer 114 is disposed on the first to fourth test lines TL1 to TL4, the first test pad TP1 and the third test pad TP3.

The second substrate SB2 includes the second base substrate 120, the back matrix BM, the over-coating layer 122 and the common electrode CE.

Although the test pads are formed in a first test area TA1 of FIG. 1 in the present exemplary embodiment, the test pads may be formed in a second test area to test gate lines as occasion demands.

Figure 4:
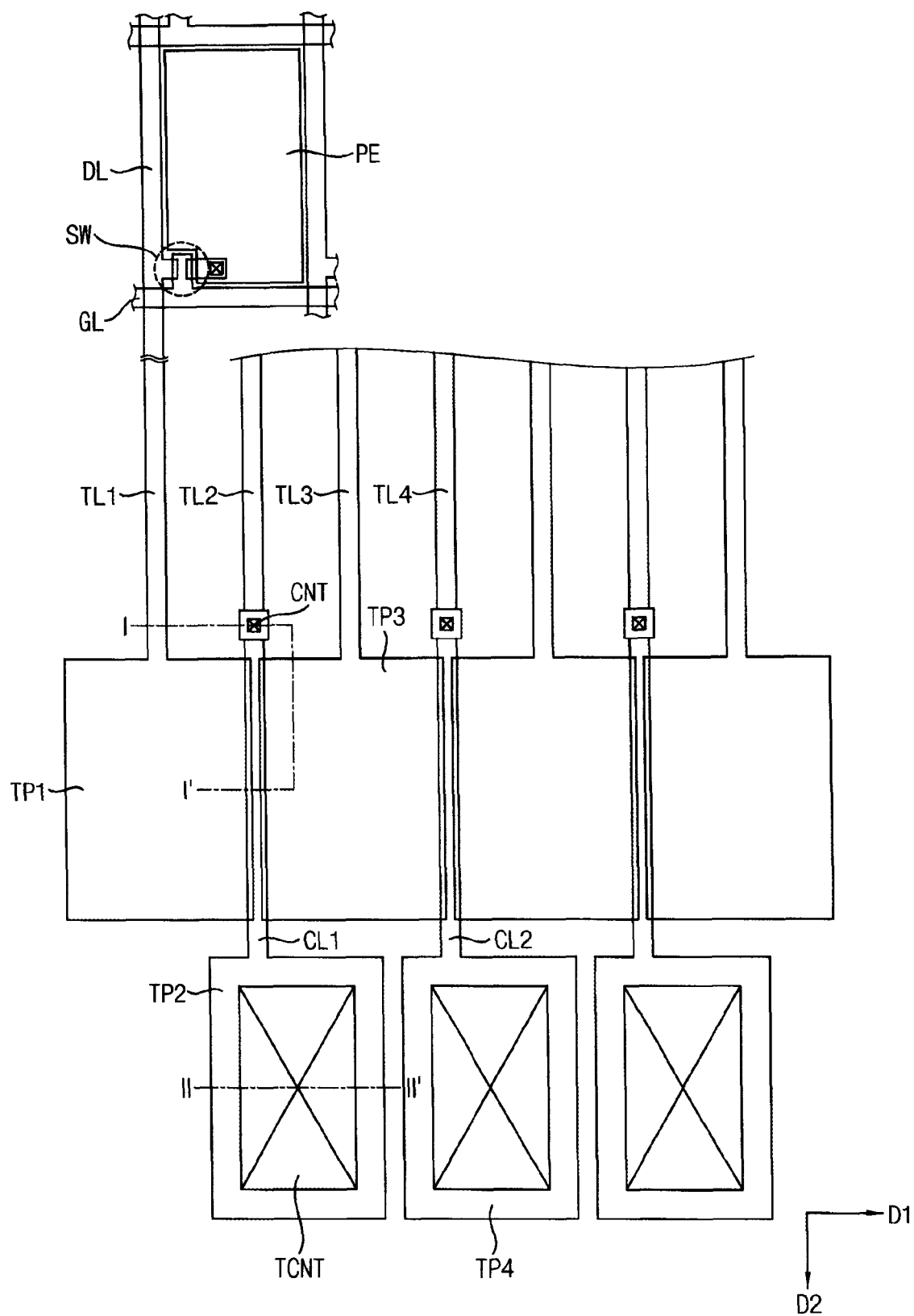
FIG. 4 is an enlarged plan view illustrating a portion of a display area and a portion of a test area of a display panel according to another exemplary embodiment of the inventive concept.
Figure 5A:
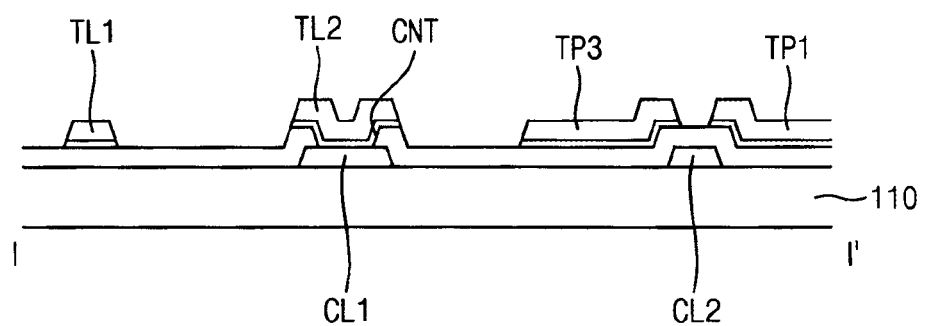
FIGS. 5A to 5B are cross-sectional views taken along a line I-I' and a line II-II' of FIG. 4.
Figure 5B:
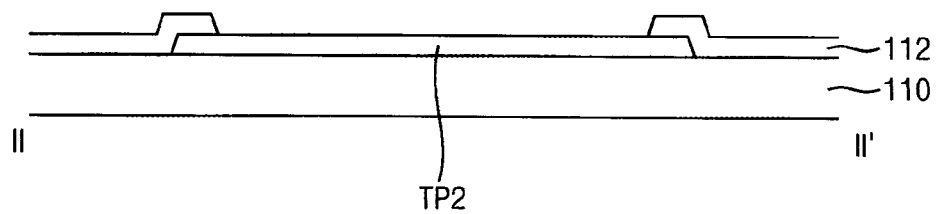

FIG. 4 is an enlarged plan view illustrating a portion of a display area and a portion of a test area of a display panel according to another exemplary embodiment of the inventive concept. FIGS. 5A to 5B are cross-sectional views taken along a line I-I' and a line II-IF of FIG. 4.

Referring to FIGS. 4 to 5B, a display panel in the test area. (refers to TA1 or TA2 of FIG. 1) may include the first substrate, the second substrate and the liquid crystal layer between the first substrate and the second substrate. The first substrate includes the first base substrate 110, connecting lines including a first connecting line CL1 and a second connecting line CL2, the first insulation layer 112, test lines including first to fourth test lines TL1 to TL4, test pads including first to fourth test pads TP1 to TP4, and the second insulation layer (refers to 114 of FIG. 3B to 3C). For convenience of description, the first base substrate 110, the first connecting line CL1, the second connecting line CL2, the first insulation layer 112, the first to fourth test lines TL1 to TL4, and the first to fourth test pads TP1 to TP4 are shown in the figures.

The first connecting line CL1 is disposed on the first base substrate 110. The first connecting line CL1 extends in a second direction D2.

The second connecting line CL2 is disposed on the first base substrate 110. The second connecting line CL2 extends in the second direction D2.

The second test pad TP2 is disposed on the first base substrate 110. The second test pad TP2 is electrically connected to the first connecting line CL1.

The fourth test pad TP4 is disposed on the first base substrate 110. The fourth test pad TP4 is disposed adjacent to the second test pad TP2 in a first direction D1. The fourth test pad TP4 is electrically connected to the second connecting line CL2.

The first insulation layer 112 is disposed on the first connecting line CL1, the second connecting line CL2, the second test pad TP2 and the fourth test pad TP4. A contact hole CNT exposing a portion of the first connecting line CL1 and a portion of the second connecting line CL2 is formed through the first insulation layer 112.

A test contact hole TCNT exposing the second test pad TP2 and the fourth test pad TP4 is formed through the first insulation layer 112.

The first to fourth test lines TL1 to TL4 are disposed on the first insulation layer 112. Each of the first to fourth test lines TL1 to TL4 extends in the second direction D2. The first to fourth test lines TL1 to TL4 are arranged in the first direction in order. Each of the first to fourth test lines TL1 to TL4 is electrically connected to each of data lines in the display area DA.

The second test line TL2 is electrically connected to the first connecting line CL1 through the contact hole CNT. The fourth test line TL4 is electrically connected to the second connecting line CL2 through a contact hole.

The first test pad TP1 is disposed on the first insulation layer 112. The first test pad TP1 is adjacent to the second test pad TP2 in the second direction D2. The first test pad TP1 is electrically connected to the first test line TL1.

The third test pad TP3 is disposed on the first insulation layer 112. The third test pad TP3 is adjacent to the first test pad TP1 in the first direction D1. The third test pad TP3 is disposed adjacent to the fourth test pad TP4 in the second direction D2. The third test pad TP3 is electrically connected to the third test line TL3.

The first connecting line CL1 is disposed between the first test pad TP1 and the third test pad TP3. The first connecting line CL1 may partially overlap the first test pad TP1 and the third test pad TP3. Accordingly, although a gap between the test lines (gap between the data lines) decreases as the number of the pixels of the display panel increases, an area of the test pad may be sufficiently large to test the display panel.

A display area of the display panel is substantially the same as a display area of FIGS. 2 to 3A. Thus, any further detailed descriptions concerning the same elements will be omitted.

Figure 6:
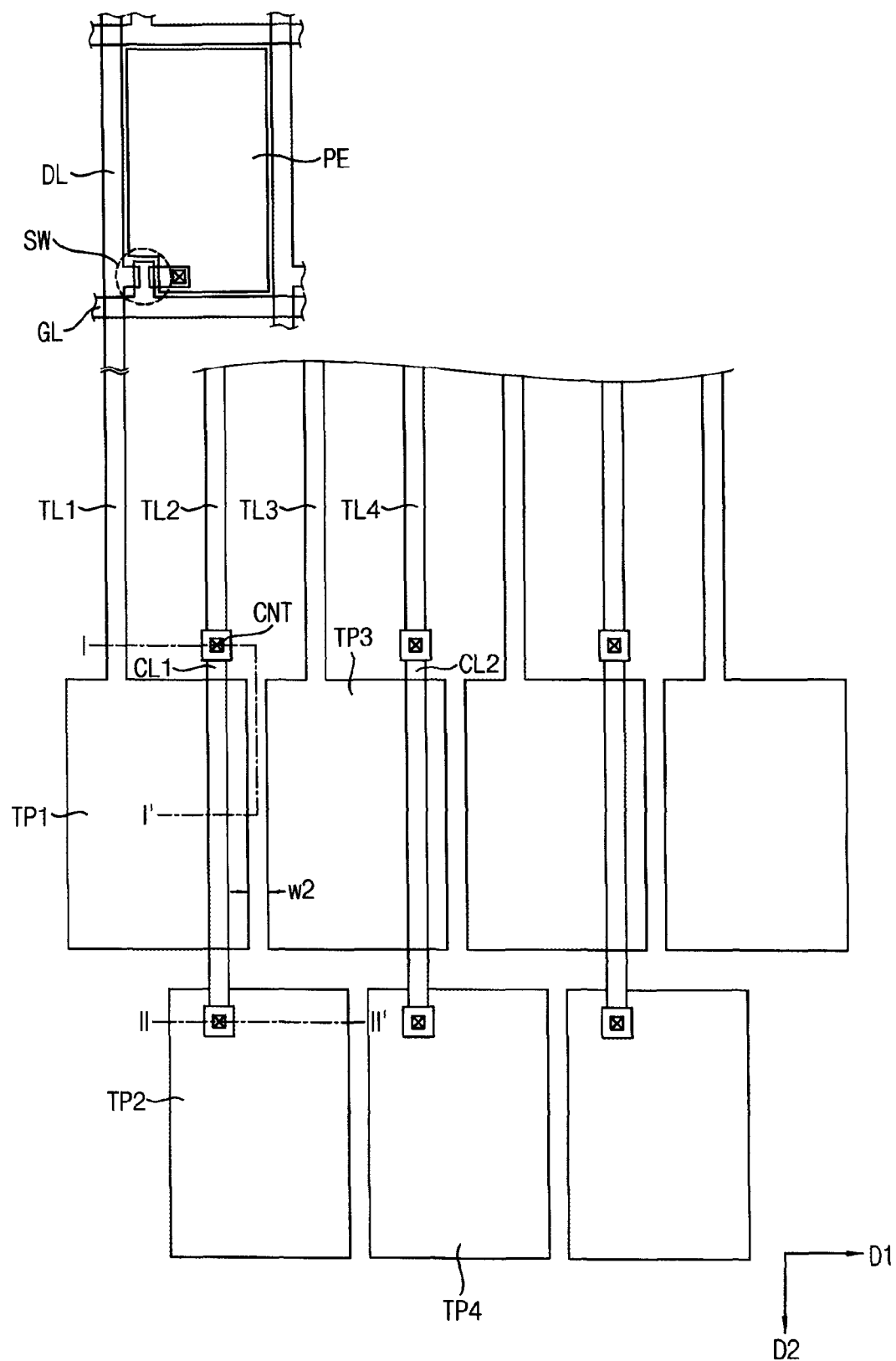
FIG. 6 is an enlarged plan view illustrating a portion of a display area and a portion of a test area of a display panel according to still another exemplary embodiment of the inventive concept.
Figure 7A:
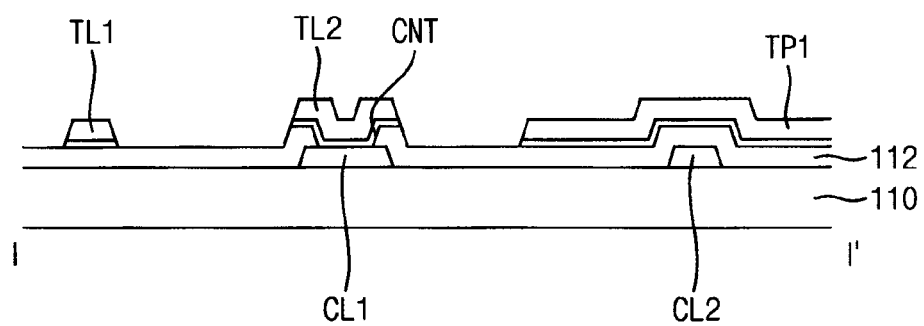
FIGS. 7A to 7B are cross-sectional views taken along a line I-I' and a line II-II' of FIG. 6.
Figure 7B:
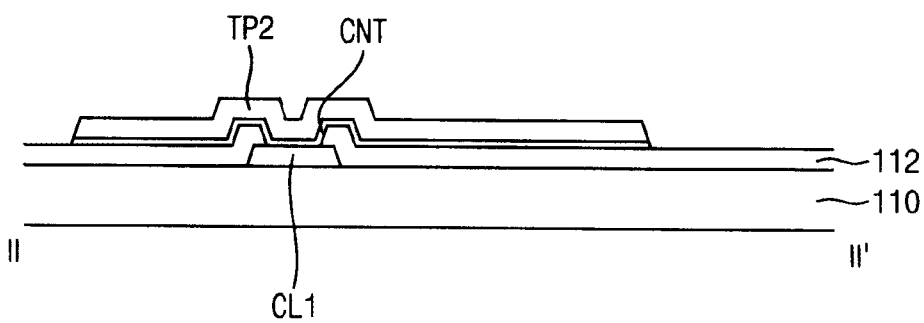

FIG. 6 is an enlarged plan view illustrating a portion of a display area and a portion of a test area of a display panel according to still another exemplary embodiment of the inventive concept. FIGS. 7A to 7B are cross-sectional views taken along a line I-I' and a line II-II' of FIG. 6.

Referring to FIGS. 6 to 7B, a display panel in the test area (refers to TA1 or TA2 of FIG. 1) may include the first substrate, the second substrate and the liquid crystal layer between the first substrate and the second substrate. The first substrate includes the first base substrate 110, connecting lines including a first connecting line CL1 and a second connecting line CL2, the first insulation layer 112, test lines including first to fourth test lines TL1 to TL4, test pads including first to fourth test pads TP1 to TP4, and the second insulation layer (refers to 114 of FIG. 3B to 3C). For convenience of description, the first base substrate 110, the first connecting line CL1, the second connecting line CL2, the first insulation layer 112, the first to fourth test lines TL1 to TL4, and the first to fourth test pads TP1 to TP4 are shown in the figures.

The first connecting line CL1 is disposed on the first base substrate 110. The first connecting line CL1 extends in a second direction D2.

The second connecting line CL2 is disposed on the first base substrate 110. The second connecting line CL2 extends in the second direction D2.

The first connecting line CL1 and the second connecting line CL2 may include a material substantially the same as a gate line in a display area. Thus, the first connecting line CL1 and the second connecting line CL2 may include metal, metal alloy, conductive metal oxide, a transparent conductive material, etc.

The first insulation layer 112 is disposed on the first connecting line CL1, the second connecting line CL2. A contact hole CNT exposing a portion of the first connecting line CL1 and a portion of the second connecting line CL2 is formed through the first insulation layer 112. The contact hole CNT may be formed on both ends of the first connecting lines CL1 and CL2.

The first to fourth test lines TL1 to TL4 is disposed on the first insulation layer 112. Each of the first to fourth test lines TL1 to TL4 extends in the second direction D2. The first to fourth test lines TL1 to TL4 are arranged in the first direction in order. Each of the first to fourth test lines TL1 to TL4 is electrically connected to each of the data lines DL in the display area.

The second test line TL2 is electrically connected to the first connecting line CL1 through the contact hole CNT. The fourth test line TL4 is electrically connected to the second connecting line CL2 through the contact hole.

The first test pad TP1 is disposed on the first insulation layer 112. The first test pad TP1 is electrically connected to the first test line TL1.

The third test pad TP3 is disposed on the first insulation layer 112. The third test pad TP3 is adjacent to the first test pad TP1 in the first direction D1. The third test pad TP3 is electrically connected to the third test line TL3.

The second test pad TP2 is disposed on the first insulation layer 112. The second test pad TP2 is disposed adjacent to the first test pad TP1 in the second direction D2. The second test line TL2 is electrically connected to the first connecting line CL1 through the contact hole CNT.

The fourth test pad TP4 is disposed on the first insulation layer 112. The fourth test pad TP4 is disposed adjacent to the second test pad TP2 in a first direction D1. The fourth test line TL4 is electrically connected to the second connecting line CL2 through the contact hole.

The first to fourth test lines TL1 to TL4 and the first to fourth test pads TP1 to TP4 may include a material substantially the same as a data line DL in the display area. Thus, the first to fourth test lines TL1 to TL4 and the first to fourth test pads TP1 to TP4 may include metal, metal alloy, conductive metal oxide, a transparent conductive material, etc.

The first connecting line CL1 overlaps the first test pad TP1, and the second connecting line CL2 overlaps the third test pad TP3. The first to fourth test pads TP1 to TP4 are formed from the same layer as the data line DL, so that the display panel may be tested before the second insulation layer is formed.

A display area of the display panel is substantially the same as a display area of FIGS. 2 to 3A. Thus, any further detailed descriptions concerning the same elements will be omitted.

Figure 8:
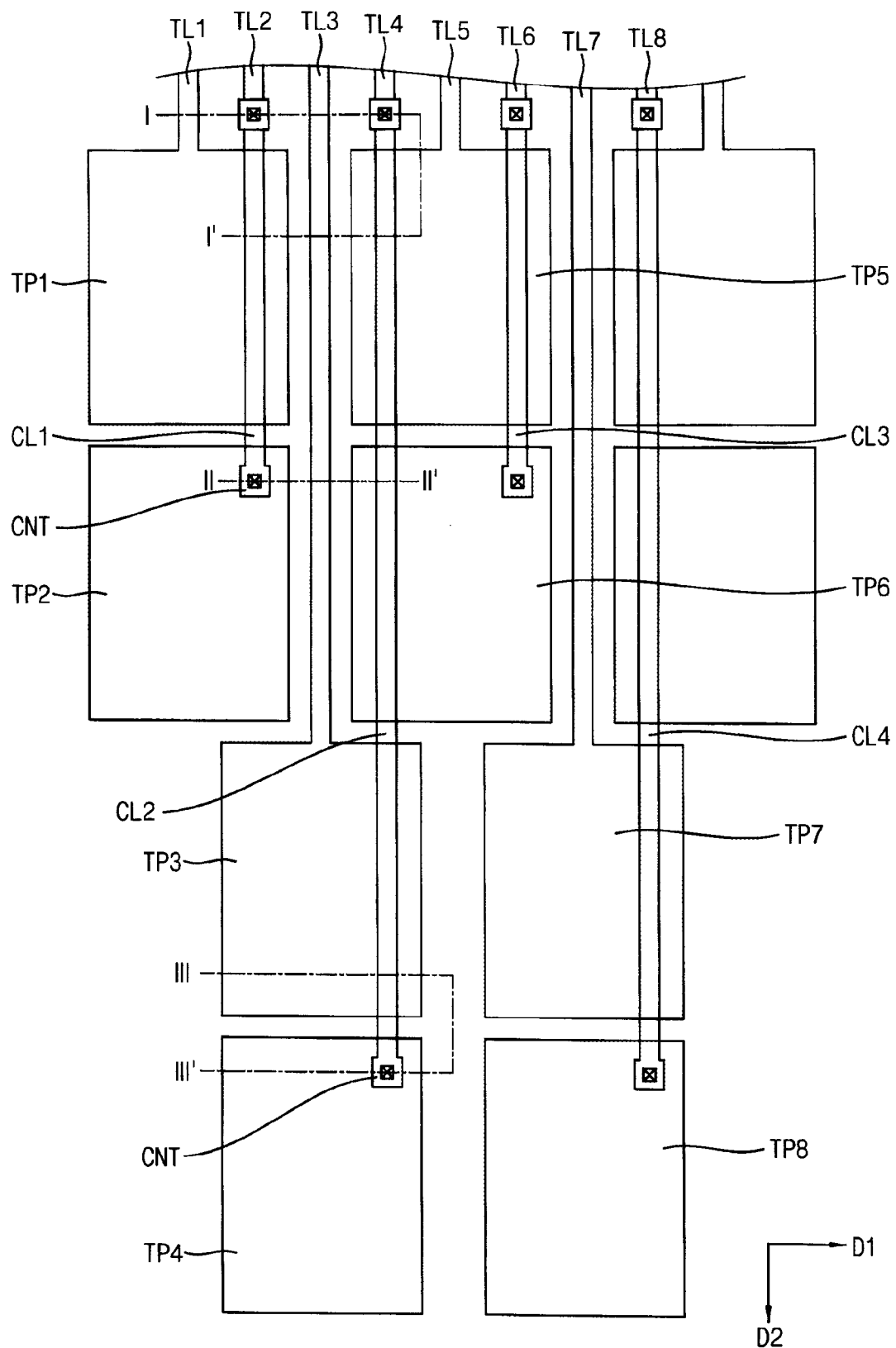
FIG. 8 is an enlarged plan view illustrating a portion of a test area of a display panel according to still another exemplary embodiment of the inventive concept.
Figure 9A:
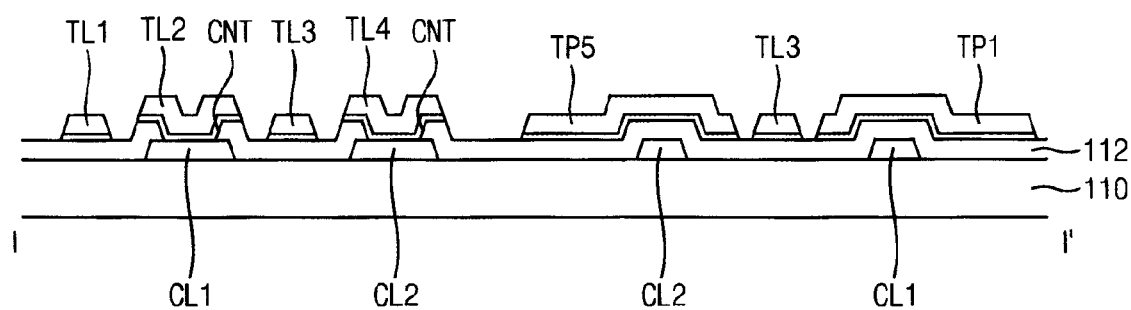
FIGS. 9A to 9C are cross-sectional views taken along a line I-I', a line II-II' and a line III-III' of FIG. 8.
Figure 9B:
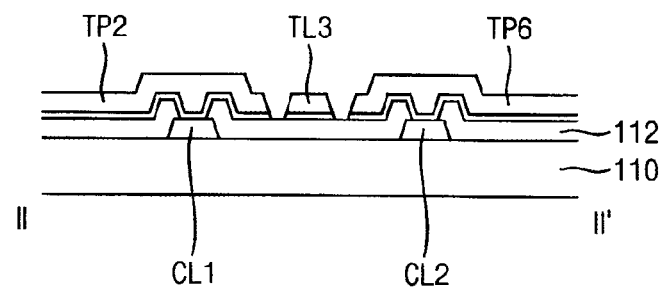
Figure 9C:
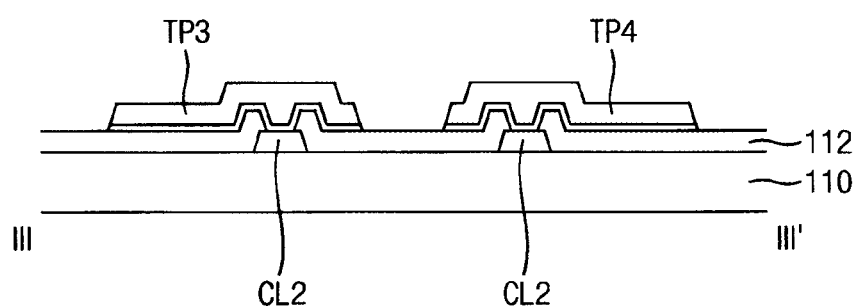

FIG. 8 is an enlarged plan view illustrating a portion of a test area of a display panel according to still another exemplary embodiment of the inventive concept. FIGS. 9A to 9C are cross-sectional views taken along a line I-I', a line II-II' and a line III-III' of FIG. 8.

Referring to FIGS. 8 to 9C, the display panel in the test area. (refers to TA1 or TA2 of FIG. 1) may include the first substrate, the second substrate and the liquid crystal layer between the first substrate and the second substrate. The first substrate includes the first base substrate 110, connecting lines including first to fourth connecting line CL1 to CL4, the first insulation layer 112, test lines including first to eighth test lines TL1 to TL8, test pads including first to eighth test pads TP1 to TP8, and the second insulation layer (refers to 114 of FIGS. 3B and 3C). For convenience of description, the first base substrate 110, the first to fourth connecting lines CL1 to CL4, the first insulation layer 112, the first to eighth test lines TL1 to TL8, and the first to eight test pads TP1 to TP8 are shown in the figures.

The first to fourth connecting line CL1 to CL4 are disposed on the first base substrate 110. Each of the first to fourth connecting line CL1 to CL4 extends in a second direction D2. The first to fourth connecting lines CL1 to CL4 are arranged in a first direction D1.

The first to fourth connecting line CL1 to CL4 may include a material substantially the same as a gate line in the display area. Thus, the first to fourth connecting line CL1 to CL4 may include metal, metal alloy, conductive metal oxide, a transparent conductive material, etc.

The first insulation layer 112 is disposed on the first to fourth connecting line CL1 to CL4. A plurality of contact holes CNT exposing portions of the first to fourth connecting lines CL1 to CL4 are formed through the first insulation layer 112. The contact holes CNT may be formed on both ends of the first connecting lines CL1, CL2, CL3 and CL4.

The first to eighth test lines TL1 to TL8 are disposed on the first insulation layer 112. Each of the first to eighth test lines TL1 to TL8 extends in the second direction D2. The first to eighth test lines TL1 to TL8 are arranged in the first direction D1. Each of the first to eighth test lines TL1 to TL8 is connected to a plurality of the data lines in the display area.

The second test line TL2 is electrically connected to the first connecting line CL1 through the contact hole CNT. The fourth test line TL4 is electrically connected to the second connecting line CL2 through the contact hole. The sixth test line TL6 is electrically connected to the third connecting line CL3 through the contact hole. The eighth test line TL8 is electrically connected to the fourth connecting line CL4 through the contact hole.

The first to eight test pads TP1 to TP8 are disposed on the first insulation layer 112. The first test pad TP1 is electrically connected to the first test line TL1.

The fifth test pad TP5 is disposed adjacent to the first test pad TP1 in the first direction D1. The fifth test pad TP5 is electrically connected to the fifth test line TL5.

The second test pad TP2 is disposed adjacent to the first test pad TP1 in the second direction D2. The second test pad TP2 is electrically connected to the first connecting line CL1 through the contact hole CNT.

The sixth test pad TP6 is disposed adjacent to the second test pad TP2 in the first direction D1. The sixth test pad TP6 is electrically connected to the third connecting line CL3 through the contact hole.

The third test pad TP3 is disposed adjacent to the second test pad TP2 in the second direction D2. The third test pad TP3 is electrically connected to the third test line TL3.

The seventh test pad TP7 is disposed adjacent to the third test pad TP3 in the first direction. The seventh test pad TP7 is electrically connected to the seventh test line TL7.

The fourth test pad TP4 is disposed adjacent to the third test pad TP3 in the second direction D2. The fourth test pad TP4 is electrically connected to the second connecting line CL2 through the contact hole.

The eighth test pad TP8 is disposed adjacent to the fourth test pad TP4 in the first direction D1. The eighth test pad TP8 is electrically connected to the fourth connecting line CL4 through the contact hole.

The first to eighth test lines TL1 to TL8 and the first to eighth test lines TP1 to TP8 may include a material substantially the same as a data line DL in a display area. Thus, the first to eighth test lines TL1 to TL8 and the first to eighth test lines TP1 to TP8 may include metal, metal alloy, conductive metal oxide, a transparent conductive material, etc.

The first connecting line CL1 overlaps the first test pad TP1.

The third test line TL3 is disposed between the first test pad TP1 and the fifth test pad TP5, and between the second test pad TP2 and the sixth test pad TP6.

The second connecting line CL2 overlaps the fifth test pad TP5, the sixth test pad TP6 and the third test pad TP3.

The third connecting line CL3 overlaps the fifth test pad TP5.

Accordingly, the test pads are properly connected to the test lines or the connecting line, so that area in the test area may be efficiently used.

The display area of the display panel is substantially the same as a display area of FIGS. 2 to 3A. Thus, any further detailed descriptions concerning the same elements will be omitted.

Figure 10:
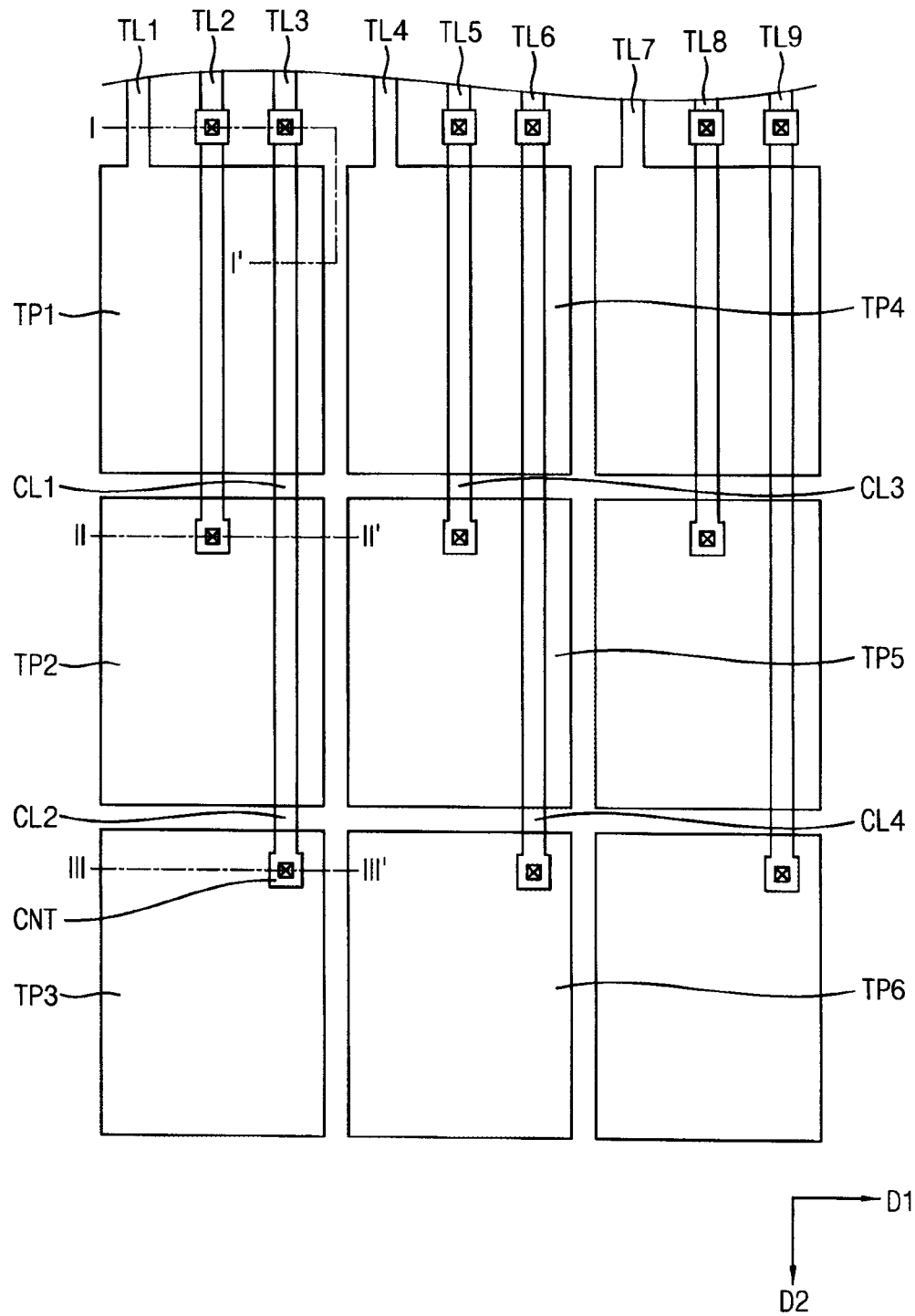
FIG. 10 is an enlarged plan view illustrating a portion of a test area of a display panel according to still another exemplary embodiment of the inventive concept.
Figure 11A:
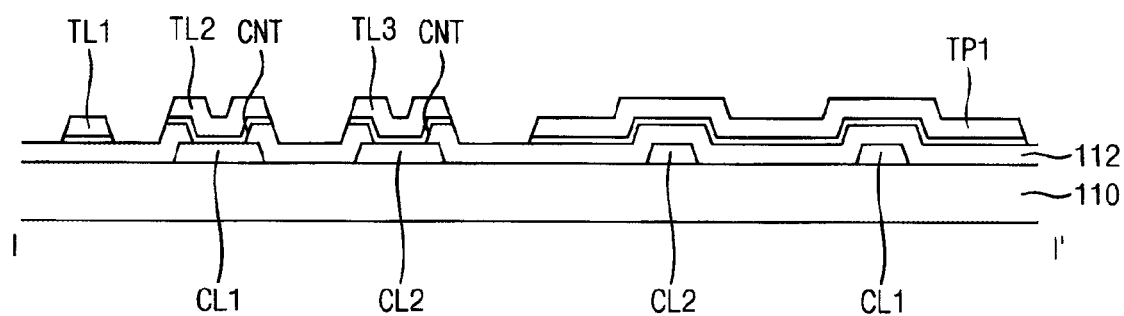
FIGS. 11A to 11C are cross-sectional views taken along a line I-I', a line II-II' and a line III-III' of FIG. 10.
Figure 11B:
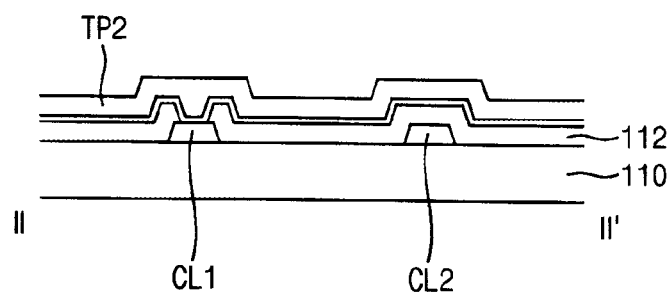
Figure 11C:
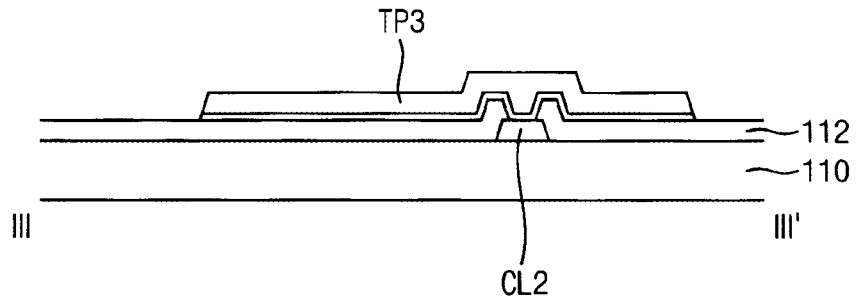

FIG. 10 is an enlarged plan view illustrating a portion of a test area of a display panel according to still another exemplary embodiment of the inventive concept. FIGS. 11A to 11C are cross-sectional views taken along a line I-I', a line II-II' and a line III-III' of FIG. 10.

Referring to FIGS. 10 and 11C, a display panel in the test area. (refers to TA1 or TA2 of FIG. 1) may include the first substrate, the second substrate and the liquid crystal layer between the first substrate and the second substrate. The first substrate includes the first base substrate 110, connecting lines including a first to fourth connecting line CL1 to CL4, the first insulation layer 112, test lines including first to sixth test lines TL1 to TL6, test pads including first to sixth test pads TP1 to TP6, and the second insulation layer (refers to 114 of FIG. 3B to 3C). For convenience of description, the first base substrate 110, the first to fourth connecting lines CL1 to CL4, the first insulation layer 112, the first to sixth test lines TL1 to TL6, and the first to sixth test pads TP1 to TP6 are shown in the figures.

The first to fourth connecting lines CL1 to CL4 are disposed on the first base substrate 110. Each of the first to fourth connecting lines CL1 to CL4 extends in a second direction D2. The first to fourth connecting lines CL1 to CL4 are arranged in a first direction D1.

The first to fourth connecting lines CL1 to CL4 may include a material substantially the same as a gate line in a display area. Thus, first to fourth connecting lines CL1 to CL4 may include metal, metal alloy, conductive metal oxide, a transparent conductive material, etc.

The first insulation layer 112 is disposed on the first to fourth connecting lines CL1 to CL4. A plurality contact holes exposing the first to fourth connecting lines CL1 to CL4 are formed through the first insulation layer 112. The contact holes CNT may be formed on both ends of the first connecting lines CL1, CL2 CL3 and CL4.

The first to sixth test lines TL1 to TL6 are disposed on the first insulation layer 112. Each of the first to sixth test lines TL1 to TL6 extends in the first direction D1. The first to sixth test lines TL1 to TL6 are arranged in the first direction D1. Each of the first to sixth test lines TL1 to TL6 is electrically connected to the data lines of the display area.

The second test line TL2 is electrically connected to the first connecting line CL1 through the contact hole CNT. The third test line TL3 is electrically connected to the second connecting line CL2 through the contact hole. The fifth test line TL5 is electrically connected to the third connecting line CL3 through the contact hole. The sixth test line TL6 is electrically connected to the fourth connecting line CL4 through the contact hole.

The first to sixth test pads TP1 to TP6 are disposed on the first insulation layer 112. The first test pad TP1 is electrically connected to the first test line TL1.

The fourth test pad TP4 is disposed adjacent to the first test pad TP1 in the first direction D1. The fourth test pad TP4 is electrically connected to the fourth test line TL4.

The second test pad TP2 is disposed adjacent to the first test pad TP1 in the second direction D2. The second test pad TP2 is electrically connected to the first connecting line CL1 trough the contact hole.

The fifth test pad TP5 is disposed adjacent to the second test pad TP2 in the first direction D1. The fifth test pad TP5 is electrically connected to the third connecting line CL3 trough the contact hole.

The third test pad TP3 is disposed adjacent to the second test pad TP2 in the second direction. The third test pad TP3 is electrically connected to the second connecting line CL2 trough the contact hole.

The sixth test pads TP6 is disposed adjacent to the third test pad TP3 in the first direction D1. The sixth test pads TP6 is electrically connected to the fourth connecting line CL4 trough the contact hole.

The first to sixth test lines TL1 to TL6 and the first to sixth test pads TP1 to TP6 may include a material substantially the same as a data line in the display area. Thus, first to sixth test lines TL1 to TL6 and the first to sixth test pads TP1 to TP6 may include metal, metal alloy, conductive metal oxide, a transparent conductive material, etc.

The first connecting line CL1 overlaps the first test pad TP1.

The second connecting line CL2 overlaps the first test pad TP1 and the second test pad TP2.

The third connecting line CL3 overlaps the fourth test pad TP4.

The fourth connecting line CL4 overlaps the fourth test pad TP4 and the fifth test pads TP5.

Accordingly, the test pads are properly connected to the test lines or the connecting line, so that area in the test area may be efficiently used.

Although the test pads are arranged in three rows in the second direction, the test pads may be arranged in more than four rows.

Figure 12:
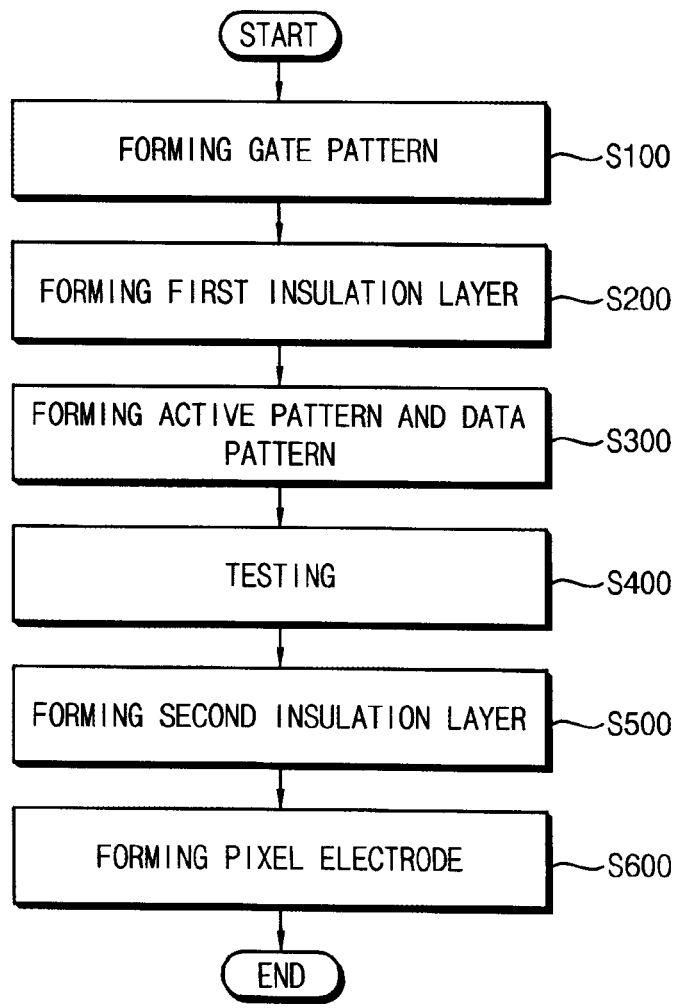
FIG. 12 is a flow chart illustrating an exemplary embodiment of a method of manufacturing the display panel according to the inventive concept.

FIG. 12 is a flow chart illustrating an exemplary embodiment of a method of manufacturing the display panel according to the inventive concept.

A method of manufacturing a display panel includes forming a gate pattern S100, forming a first insulation layer S100, forming an active pattern and a data pattern S300, testing S400, forming a second insulation layer S 500 and forming a pixel electrode S600.

In forming the gate pattern S100, a gate pattern including first and second connecting lines arranged in a first direction on a first base substrate and extending in a second direction which is substantially perpendicular to the first direction.

In forming the first insulating layer, a first insulation layer is formed on the gate pattern, and a plurality of contact holes exposing the first and second connecting lines are formed through the first insulation layer.

In forming the active pattern and the data pattern S300, an active pattern and a data pattern is formed on the first insulation layer. The data pattern includes first to fourth test lines extending in the second direction and arranged in the first direction. The second test line is electrically connected to the first connecting line through the contact hole. The fourth test line is electrically connected to the second connecting line through the contact hole.

In testing S400, the gate pattern, the active pattern and the data pattern are test by using a plurality of test pads.

In forming second insulation layer S 500, a second insulation layer having a plurality of contact holes exposing drain electrodes is formed on the data pattern.

In forming the pixel electrode S600, a pixel electrode is formed on the second insulation layer. The pixel electrode S600 is connected to the drain electrode.

Accordingly, a first substrate (refers to SB1 of FIGS. 2 to 3C) including the first base substrate, the gate pattern, the first insulation layer, the data pattern, the second insulation layer and the pixel electrode may be formed. And then, a second substrate (refers to SB2 of FIGS. 2 to 3C) and a liquid crystal layer (refers to 130 of FIGS. 2 to 3C) are formed so that a display panel may be formed.

The method of manufacturing the display panel will be described in FIGS. 13 to 20B, hereinafter.

FIGS. 13 to 16B are plan views and cross-sectional views illustrating a method of manufacturing the display panel of FIG. 2.

Figure 13:
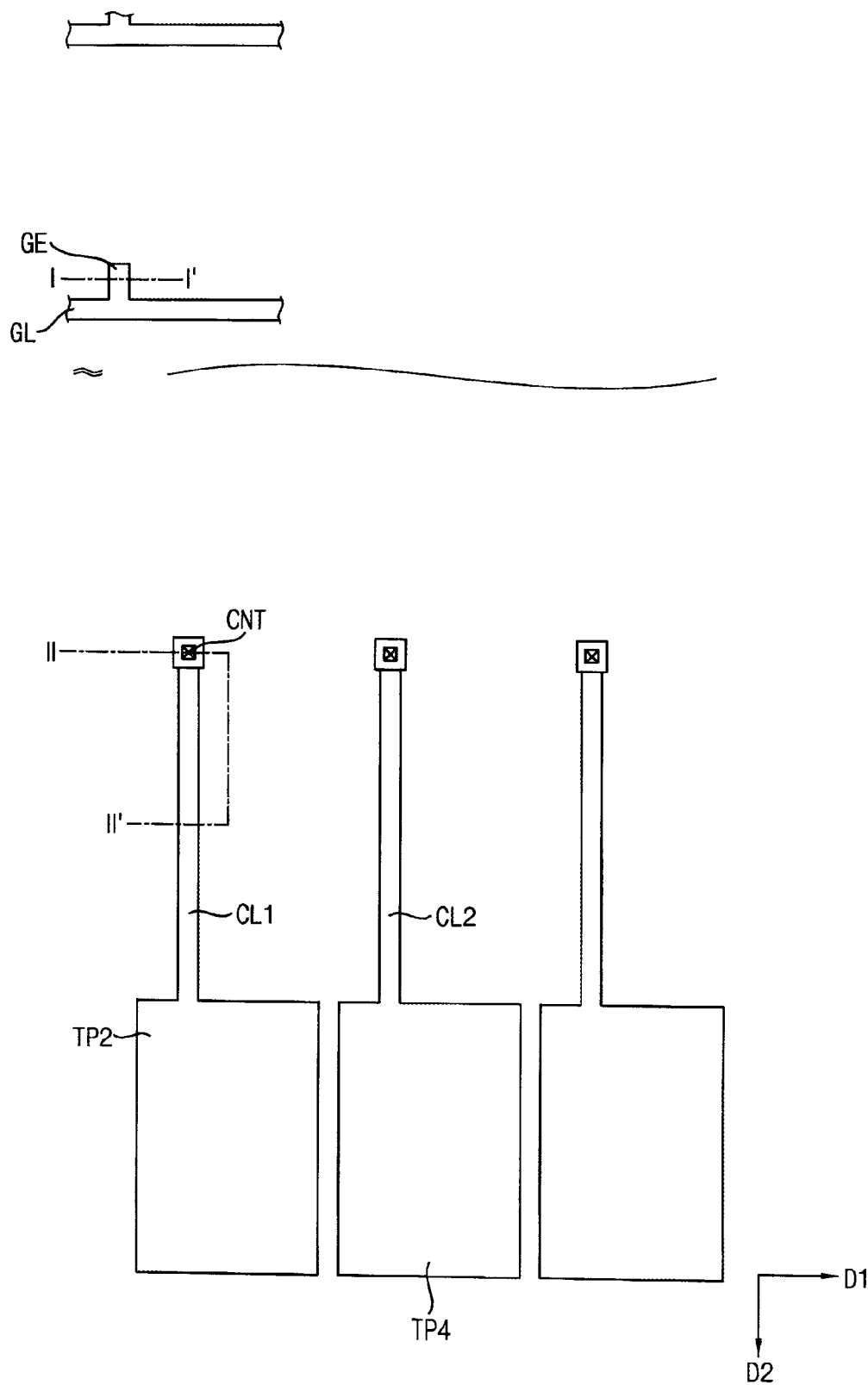
FIGS. 13 to 16B are plan views and cross-sectional views illustrating a method of manufacturing the display panel of FIG. 2.
Figure 14A:
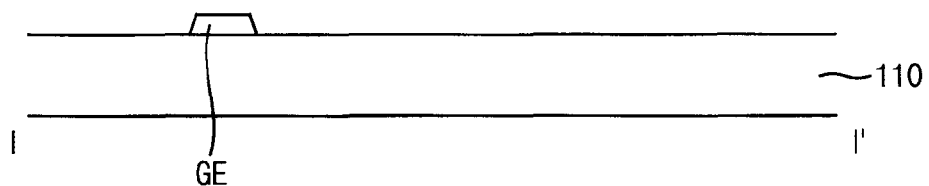
Figure 14B:
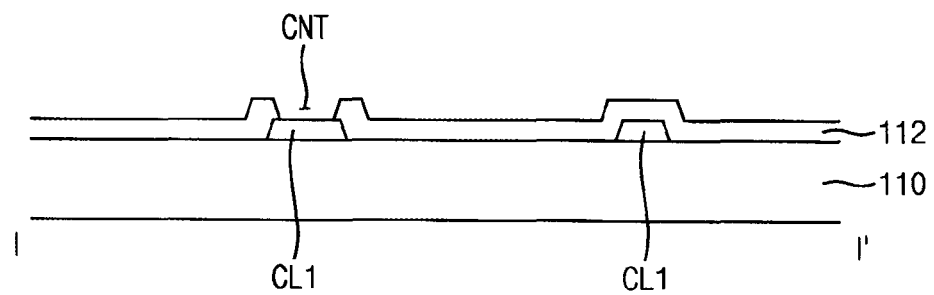

Referring to FIGS. 13 to 14B, a gate line GL, a gate electrode GE, a first connecting line CL1, a second connecting line CL2, a second test pad TP2 and the fourth test pad TP4 are formed on a first base substrate 110.

The gate line GL extends in a first direction D1. The gate electrode GE is electrically connected to the gate line GL. The first connecting line CL1 extends in a second direction D2. The second connecting line CL2 extends in the second direction D2. The first and second connecting line CL1 and CL2 extends in the first direction D1. The second test pad TP2 is electrically connected to the first connecting line CL1. The fourth test pad TP4 is disposed adjacent to the second test pad TP2 in the first direction D1. The fourth test pad TP4 is electrically connected to the second connecting line CL2.

A metal layer is formed on the first base substrate 110, and then the metal layer may be selectively etched by a photolithography process and an etching process using a mask. Hence, a gate line GL, the gate electrode GE, the first connecting line CL1, the second connecting line CL2, the second test pad TP2 and the fourth test pad TP4 may be formed.

The first insulation layer 112 is formed on the gate line GL, the gate electrode GE, the first connecting line CL1, the second connecting line CL2, the second test pad TP2 and the fourth test pad TP4. The first insulation layer 112 may be formed by a spin coating process, a printing process, a sputtering process, a CVD process, an ALD process, a PECVD process, an HDP-CVD process or a vacuum evaporation process in accordance with ingredients included in first insulation layer 112.

A contact hole CNT exposing the first connecting line CL1 and the second connecting line CL2 is formed through the first insulation layer 112.

Figure 15:
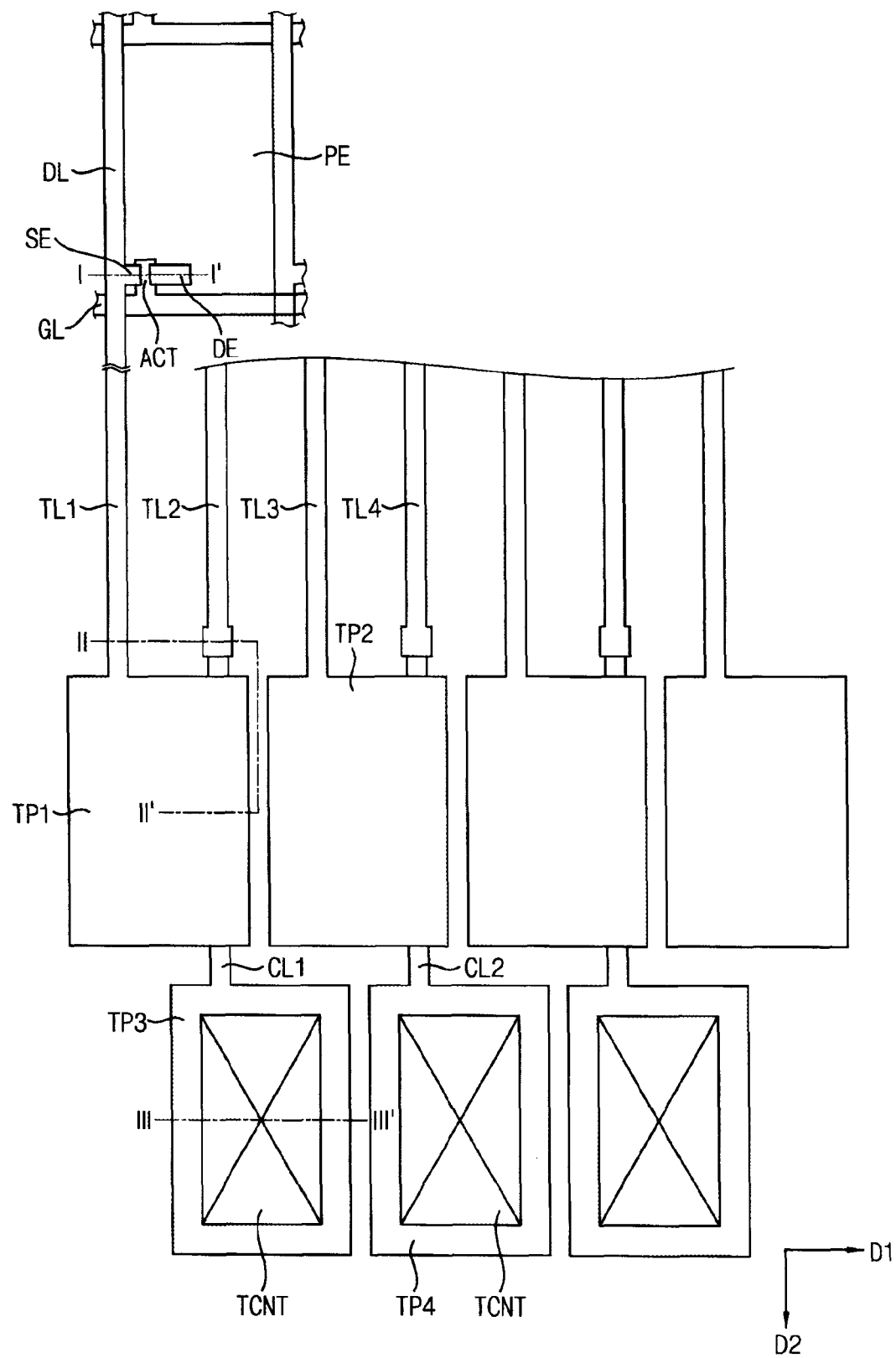
Figure 16A:
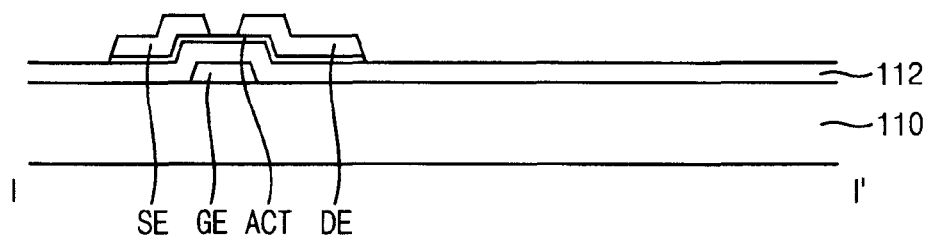
Figure 16B:
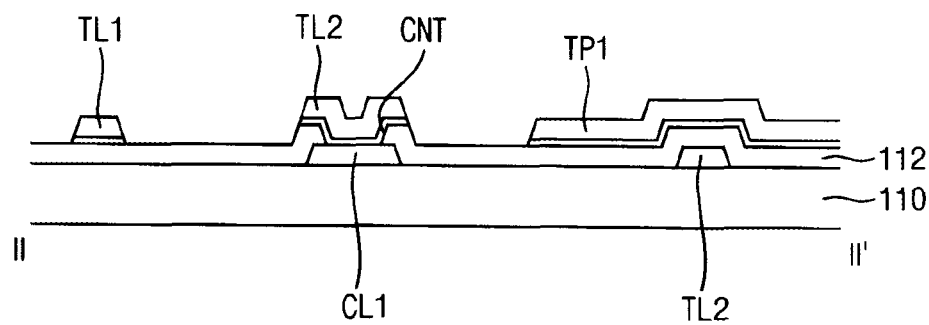

Referring to FIGS. 15 to 16B, an active pattern ACT, a data line DL, a source electrode SE, a drain electrode DE, first to fourth test lines TL1 to TL4, a first test pad TP1 and a third test pad TP3 are formed on the first insulation layer 112.

The active pattern ACT overlaps the gate electrode GE. The data line DL extends in a second direction D2 substantially perpendicular to the first direction D1. The data line DL crosses the gate line GL. The source electrode SE is electrically connected to the data line DL. The drain electrode DE is spaced apart from the source electrode SE. Each of the first to fourth test lines TL1 to TL4 extends in the second direction D2. The first to fourth test lines TL1 to TL4 are arranged in the first direction D1 in order. Each of the first to fourth test lines TL1 to TL4 is electrically connected to each of the data lines DL. The first test pad TP1 is adjacent to the second test pad TP2 in the second direction D2. The first test pad TP1 is electrically connected to the first test line TL1. The third test pad TP3 is adjacent to the first test pad TP1 in the first direction D1. The third test pad TP3 is disposed adjacent to the fourth test pad TP4 in the second direction D2.

An active layer and a metal layer are formed on the first insulation layer 112 in order, and then the metal layer and the active layer may be selectively etched by a photolithography process and an etching process using an additional mask. Hence, the active pattern ACT, the data line DL, the source electrode SE, the drain electrode DE, the first to fourth test lines TL1 to TL4, the first test pad TP1 and the third test pad TP3 may be formed. For example, the source and drain electrodes and the active pattern ACT may be formed by using a half-tone mask.

A test contact hole exposing the second test pad TP2 and the fourth test pad TP4 is formed through the first insulation layer 112.

The display panel may be tested using the first to fourth test pads TP1 to TP4. After that, a second insulation layer is formed on the active pattern ACT, the data line DL, the source electrode SE, the drain electrode DE, the first to fourth test lines TL1 to TL4, the first test pad TP1 and the third test pad TP3. After that, a pixel electrode is formed on the second insulation layer, so that the first substrate may be formed.

After that, a second substrate (refers to SB2 of FIGS. 2 to 3C) and a liquid crystal layer (refers to 130 of FIGS. 2 to 3C) are formed, so that the display panel may be completed.

FIGS. 17 to 20B are plan views and cross-sectional views illustrating a method of manufacturing the display panel of FIG. 6.

Referring to FIGS. 17 to 18B, a gate line GL, a gate electrode GE, a first connecting line CL1, and a second connecting line CL2 are formed on a first base substrate 110

The gate line GL extends in a first direction D1. The gate electrode GE is electrically connected to the gate line GL. The first connecting line CL1 extends in a second direction D2. The second connecting line CL2 extends in the second direction D2. The first and second connecting line CL1 and CL2 are arranged in the first direction D1 in order.

A metal layer is formed on the first base substrate 110, and then the metal layer may be selectively etched by a photolithography process and an etching process using a mask. Hence, a gate line GL, the gate electrode GE, the first connecting line CL1, the second connecting line CL2 may be formed.

The first insulation layer 112 is formed on the gate line GL, the gate electrode GE, the first connecting line CL1, the second connecting line CL2. The first insulation layer may be formed by a spin coating process, a printing process, a sputtering process, a CVD process, an ALD process, a PECVD process, an HDP-CVD process or a vacuum evaporation process in accordance with ingredients included in first insulation layer 112.

A contact hole CNT exposing the first connecting line CL1 and the second connecting line CL2 is formed through the first insulation layer 112.

Figure 19:
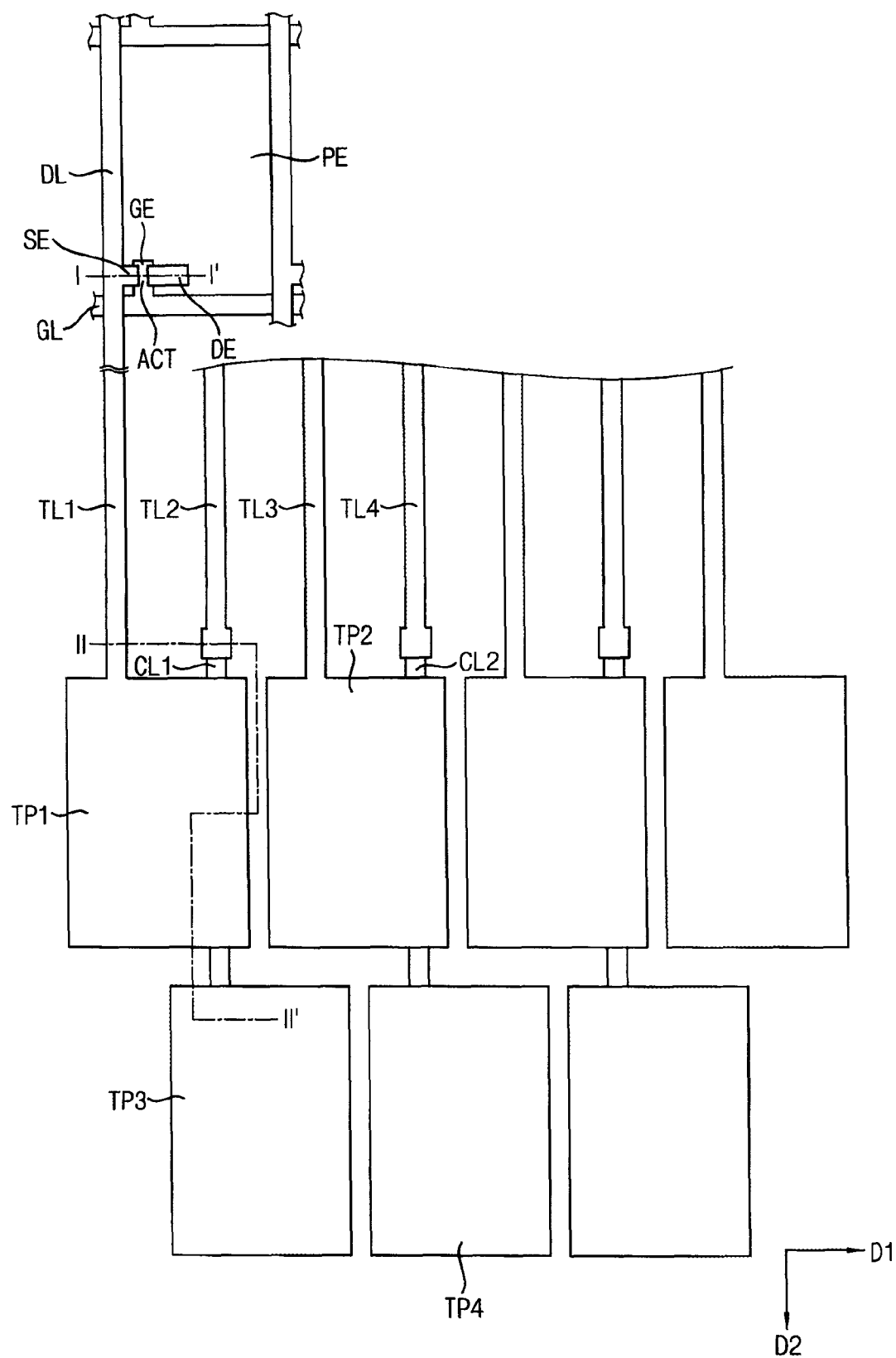
Figure 20A:
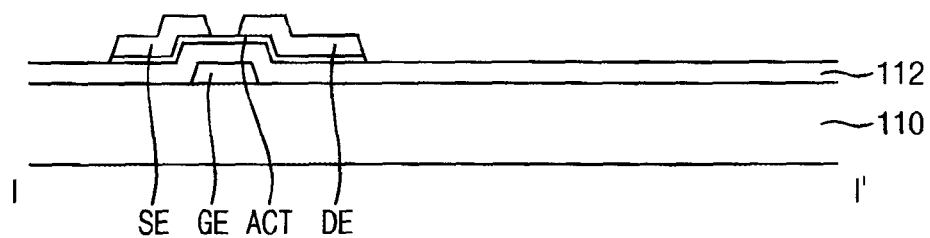
Figure 20B:
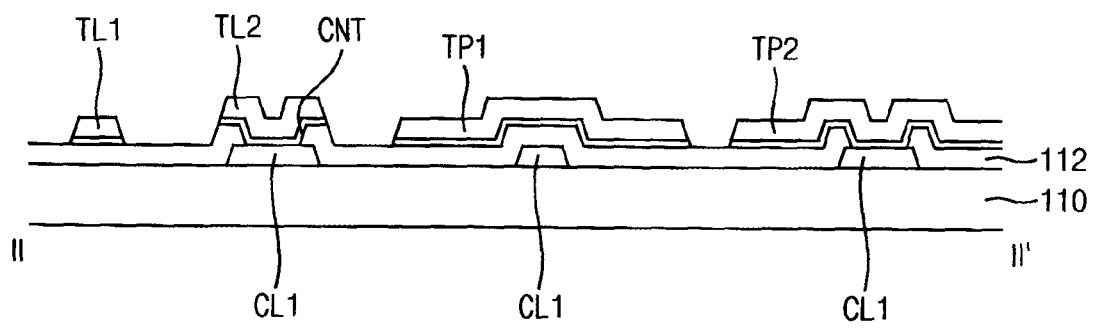

Referring to FIGS. 19 to 20B, an active pattern ACT, a data line DL, a source electrode SE, a drain electrode DE, first to fourth test lines TL1 to TL4, first to fourth test pads TP1 to TP4 are formed on the first insulation layer 112.

The active pattern ACT overlaps the gate electrode GE. The data line DL extends in a second direction D2 substantially perpendicular to the first direction D1. The data line DL crosses the gate line GL. The source electrode SE is electrically connected to the data line DL. The drain electrode DE is spaced apart from the source electrode SE. Each of the first to fourth test lines TL1 to TL4 extends in the second direction D2. The first to fourth test lines TL1 to TL4 are arranged in the first direction D1 in order. Each of the first to fourth test lines TL1 to TL4 is electrically connected to each of the data lines DL.

The second test line TL2 is electrically connected to the first connecting line CL1 through the contact hole CNT. The fourth test line TL4 is electrically connected to the second connecting line CL2 through the contact hole.

The first test pad TP1 is electrically connected to the first test line TL1. The third test pad TP3 is disposed adjacent to the first test pad TP1 in the first direction D1. The third test pad TP3 is electrically connected to the third test line TL3.

The second test pad TP2 is disposed adjacent to the first test pad TP1 in the second direction D2. The second test pad TP2 is electrically connected to the first connecting line CL1 through the contact hole CNT. The fourth test pad TP4 is disposed on the first insulation layer 112. The fourth test pad TP4 is disposed adjacent to the second test pad TP2 in the first direction D1. The fourth test pad TP4 is electrically connected to the second connecting line CL2 through the contact hole.

An active layer and a metal layer are formed on the first insulation layer 112 in order, and then the metal layer and the active layer may be selectively etched by a photolithography process and an etching process using an additional mask. Hence, the active pattern ACT, the data line DL, the source electrode SE, the drain electrode DE, the first to fourth test lines TL1 to TL4, the first to fourth test pad TP3 may be formed. For example, the source and drain electrodes and the active pattern ACT may be formed by using a half-tone mask.

The display panel may be tested using the first to fourth test pads TP1 to TP4. A second insulation layer is formed on the active pattern ACT, the data line DL, the source electrode SE, the drain electrode DE, the first to fourth test lines TL1 to TL4, the first to fourth test pad TP1 to TP4. After that, a pixel electrode is formed on the second insulation layer, so that the first substrate may be formed.

A second substrate (refers to SB2 of FIGS. 2 to 3C) and a liquid crystal layer (refers to 130 of FIGS. 2 to 3C) are formed, so that the display panel may be completed.

According to the exemplary embodiments of the present inventive concept, a display panel includes a connecting line formed from the same layer as a gate line and overlapping a test pad. Although a gap between the test lines (or data lines) deceases as the number of pixel increases, sizes the test pads may be sufficiently large to test the display panel.

The foregoing embodiments are illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display panel comprising:
   a base substrate;
   a gate pattern disposed on the base substrate;
   a data pattern disposed on the base substrate; and
   a first insulation layer disposed between the gate pattern and the data pattern,
   wherein the display panel is divided a display area in which an image is displayed and a test area disposed adjacent to the display area,
   wherein in the display area, the display panel comprises:
      a plurality of gate lines extending in a first direction;
      a plurality of data lines crossing the gate line and extending in a second direction substantially perpendicular to the first direction; and
      a switching element electrically connected to the gate line and the data line,
   wherein in the test area, the display panel comprises:
      first to fourth test lines connected to the each of the data lines, extending in the second direction, and arranged in the first direction;
      a first test pad electrically connected to the first test line, the first test pad and the first test line being formed from a same layer;
      a second test pad electrically connected to the second test line through a contact hole formed through the first insulation layer, and disposed adjacent to the first test pad in the second direction;
      a third test pad electrically connected to the third test line and disposed adjacent to the first test pad in the first direction, the third test pad and the third test line being formed from a same layer; and
      a fourth test pad electrically connected to the fourth test line through a contact hole formed through the first insulation layer, and disposed adjacent to the third test pad in the second direction.

2. The display panel of claim 1, wherein the data pattern comprises the first to fourth test lines.

3. The display panel of claim 2, wherein the gate pattern comprises the gate line and the first and third test pads.

4. The display panel of claim 3, wherein test contact holes exposing the first and third test pads are formed through the first insulation layer.

5. The display panel of claim 2, further comprising:
   a first connecting line which electrically connects the second test pad to the second test line; and
   a second connecting line which electrically connects the fourth test pad to the fourth test line, and
   wherein the gate pattern comprises the first connecting line and the second connecting line.

6. The display panel of claim 5, wherein the data pattern comprises the second test pad and the fourth test pad,
   the second test pad is electrically connected to the first connecting line though a contact hole formed through the first insulation layer, and the fourth test pad is electrically connected to the second connecting line though a contact hole formed through the first insulation layer.

7. The display panel of claim 5, wherein the first connecting line overlaps the first test pad, and
   the second connecting line overlaps the third test pad.

8. The display panel of claim 5, wherein the first connecting line is disposed between the first test pad and the second test pad, and the first connecting line partially overlaps the first and second test pads.

9. The display panel of claim 5, wherein a gap between the first test pad and the third test pad is same as or smaller than a width of the first test line.

10. The display panel of claim 5, further comprises:
a fifth test line disposed between the first test pad and the third test pad, and between the second test pad and the fourth test pad; and
a fifth test pad electrically connected to the fifth test line, and adjacent to the second test pad in the second direction.

11. The display panel of claim 5, further comprises:
a third connecting line disposed between the first connecting line and the second connecting line;
a fifth connecting line disposed between the second test line and the third test line, and electrically connected to the third connecting line through a contact hole formed through the first insulation layer; and
a fifth test pad electrically connected to the fifth test line.

12. The display panel of claim 11, wherein the gate pattern comprises the third connecting line,
the data pattern comprises the fifth test line and the fifth test pad.

13. The display panel of claim 1, further comprises:
a second insulation layer disposed on the data pattern; and
a pixel electrode disposed on the second insulation layer, and electrically connected to the switching element.

14. The display panel of claim 1, wherein the switching element overlaps the gate electrode, and comprises an active pattern disposed between the first insulation layer and the source and drain electrodes,
the active pattern comprises an oxide semiconductor, and
the oxide semiconductor comprises the an amorphous oxide comprising at least one selected from the group consisting of indium (In), zinc (Zn), gallium (Ga), tin (Sn) and hafnium (Hf).

* * * * *